US012803578B2

(12) United States Patent
Palm et al.

(10) Patent No.: US 12,803,578 B2
(45) Date of Patent: Nov. 17, 2026

(54) TIME-INTERLEAVED CURRENT-STEERING DIGITAL TO ANALOG CONVERTER

(71) Applicant: Telefonaktiebolaget LM Ericsson (publ), Stockholm (SE)

(72) Inventors: Mattias Palm, Bara (SE); Martin Anderson, Löddeköpinge (SE); Pavel Angelov, Ljungsbro (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 160 days.

(21) Appl. No.: 18/839,219

(22) PCT Filed: Feb. 24, 2022

(86) PCT No.: PCT/EP2022/054672

§ 371 (c)(1),
(2) Date: Aug. 16, 2024

(87) PCT Pub. No.: WO2023/160796

PCT Pub. Date: Aug. 31, 2023

(65) Prior Publication Data

US 2025/0167796 A1 May 22, 2025

(51) Int. Cl.
*H03M 1/82* (2006.01)
*H03M 1/66* (2006.01)

(52) U.S. Cl.
CPC ............. *H03M 1/82* (2013.01); *H03M 1/662* (2013.01)

(58) Field of Classification Search
CPC ................................ H03M 1/82; H03M 1/662
USPC ......................... 341/155, 120, 118, 159, 126
See application file for complete search history.

(56) References Cited

U.S. PATENT DOCUMENTS

| | | | |
|---|---|---|---|
| 7,710,188 B1 | 5/2010 | An et al. | |
| 9,397,676 B1 | 7/2016 | Nguyen | |
| 2003/0151533 A1 | 8/2003 | Khoini-Poorfard et al. | |
| 2005/0258992 A1* | 11/2005 | Fontaine | H03M 1/662 341/144 |

(Continued)

OTHER PUBLICATIONS

International Search Report and Written Opinion dated Apr. 5, 2024 for International Application No. PCT/EP2023/072834 Filed Aug. 18, 2023 consisting of 14 pages.

(Continued)

*Primary Examiner* — Peguy Jean Pierre
(74) *Attorney, Agent, or Firm* — Weisberg I.P. Law, P.A.

(57) ABSTRACT

The present disclosure describes a time-interleaved current-steering digital to analog converter, TI-IDAC, having a first sub-DAC, a second sub-DAC, a load switch and an interleaving switch arranged between the sub-DACs and the load switch. The interleaving switch is configured to interleave between the sub-DACs by control of a connection between the first sub-DAC and an input port of the load switch, and control of a connection between the second sub-DAC and the input port of the load switch. Further to this, the load switch is configured such that the input port of the load switch is connected to a reset load of the TI-IDAC at least when the interleaving switch changes at least one of the connections between the sub-DACs and the input port of the load switch. Associated methods, electronic equipment, integrated circuits, computer programs and carriers are also disclosed.

26 Claims, 15 Drawing Sheets

(56) References Cited

U.S. PATENT DOCUMENTS

| | | | | |
|---|---|---|---|---|
| 2006/0176200 A1* | 8/2006 | Lin | G09G 3/3688 341/144 |
| 2007/0126616 A1* | 6/2007 | Cho | H03M 1/0673 341/144 |
| 2008/0198053 A1* | 8/2008 | Tsang | H03M 1/0678 341/144 |
| 2019/0372587 A1 | 12/2019 | Wong et al. | |
| 2021/0126644 A1 | 4/2021 | Sharma et al. | |

OTHER PUBLICATIONS

International Search Report and Written Opinion dated Oct. 5, 2022 for International Application No. PCT/EP2022/054672 filed Feb. 24, 2022; consisting of 11 pages.

Mcdonnell, S.M., et al.; Compensation and Calibration Techniques for Current-Steering DACs; IEEE Circuits and Systems Magazine; Second Quarter 2017; May 19, 2017; consisting of 23 pages.

Vorenkamp, P., et al.; Fully Bipolar, 120-Msample/s 10-b Track-and-Hold Circuit; IEEE Journal of Solid-State Circuits, No. 7, New York, US, Jul. 27, 1992, consisting of 5 pages.

Caragiulo, P., et al.; A 2X Time-Interleaved 28-GS/s 8-Bit 0.03-mm2 Switched-Capacitor DAC in 16-nm FinFET CMOS; IEEE Journal of Solid-State Circuits, vol. 56, No. 8, Aug. 2021, consisting of 12 pages.

Kim, W-C., et al.; A 6b 28GS/s Four-channel Time-interleaved Current-Steering DAC with Background Clock Phase Calibration; 2019 Symposium on VLSI Circuits Digest of Technical Papers; 2019; consisting of 2 pages.

Olieman, E., et al.; An Interleaved Full Nyquist High-Speed DAC Technique; IEEE Journal of Solid-State Circuits, vol. 50, No. 3; Jan. 23, 2015; consisting of 10 pages.

Bugeja, A.R., et al.; A 14-b, 100-MS/s CMOS DAC Designed for Spectral Performance; IEEE Journal of Solid-State Circuits, vol. 34, No. 12; Dec. 1999; consisting of 14 pages.

Paton, S., et al.; A 70-mW 300-MHz CMOS Continuous-Time Σ Δ ADC With 15-MHz Bandwidth and 11 Bits of Resolution; IEEE Journal of Solid-State Circuits, vol. 39, No. 7; Jul. 2004; consisting of 8 pages.

* cited by examiner

TIME-INTERLEAVED CURRENT-STEERING DIGITAL TO ANALOG CONVERTER

CROSS-REFERENCE TO RELATED APPLICATION

This application is a Submission Under 35 U.S.C. § 371 for U.S. National Stage Patent Application of International Application Number: PCT/EP2022/054672, filed Feb. 24, 2022 entitled "TIME-INTERLEAVED CURRENT-STEERING DIGITAL TO ANALOG CONVERTER," the entirety of which is incorporated herein by reference.

TECHNICAL FIELD

The present invention relates to digital to analog converters (DACs), and more precisely to a time-interleaved current-steering DAC.

BACKGROUND

The conversion of signals from the digital domain to the analog domain is a task generally performed by digital-to-analog converters (DACs). DACs are used in electronic equipment within all fields where there is a need to convert a digital signal to an analog signal. Within many of these fields, there is a demand for increased bandwidth as the frequency of the digital signals increase, e.g. wireless communication standards such as 5G and beyond are likely to use ever higher bandwidth and carrier frequencies compared to current standards. This evolution poses stringent requirements on the DACs used in e.g. transmitters as they need to maintain high linearity, high SNR, low levels of spurs, and other emission contributions in the output signal spectrum. Sampling rates reaching 10's of GHz may be needed in order to generate high bandwidth baseband transmitter signals, or even the RF signal directly and thereby enabling bypassing of the up-conversion in the analog domain altogether.

High speed operation DACs are typically based on differential current-steering DAC techniques. The current-steering DAC converts a digital word into a current, which is converted into an output voltage by load resistors.

These high capability DACs are anything but trivial to design and they are paired with extremely tight requirements on every sub-block. At high speed, dynamic effects tend to dominate over static effects, e.g. switching and timing effects dominate over matching of the current sources which set the weights of DAC cells. One major dynamic effect is caused by mismatch in the transition of the data switches, i.e. switches that change state when a digital input signal, a digital word, changes value. It is crucial that all data switches controlled by the digital word are time-aligned with very tight tolerances. If not perfectly matched, clock routing to all current cells will add timing skew which will increase power consumption of the DAC and make it even more challenging to reach sub picosecond timing accuracy over large distance. A second major dynamic effect is the current cell settling. When a DAC cell of the current-steering DAC switches the current from one side to the other (differential architecture), the current out from the current-steering DAC will have an exponential settling that depends on time-constants in the DAC circuits. In order to achieve a binary weighted signal, the time constants of all DAC cells are preferably identical, e.g. the most significant bit (MSB) and the least significant bit (LSB) should have equal settling behavior. This can in theory be achieved by having all DAC cells based on unit cells with identical time constants.

However, in practice, DACs are typically segmented into thermometer coded and binary coded parts. Therefore, it is not feasible to base the entire DAC design on unit cells and thus, achieving identical settling for the MSB and LSB is difficult.

The sensitivity to data timing and current cell settling may be reduced with a time-interleaved DAC architecture. A time-interleaved DAC architecture is an architecture comprising a plurality of sub-DACs configured to operate in a time-interleaved manned such that e.g. a first data sample is converted by a first sub-DAC, a second consecutive data sample is converted by a second sub-DAC and so on. Time-interleaving effectively reduces the switching frequency of each sub-DAC and the time-interleaved DAC architecture may be extended to an arbitrary number of sub-DACs to further reduce the clock rate of each sub-DAC. The outputs of the sub-DACs are multiplexed to achieve an overall full data rate.

One major challenge when designing a time-interleaved current-steering DAC is that the sub-DACs must match in offset, gain and time. Further to this, the multiplexing of the sub-DACs may cause timing errors and current cell settling errors to propagate to the output of the time-interleaved DAC.

In US 2021/0126644 A1, a digital circuitry configured to "pre-cancel" an interleaving image by adding, to a digital DAC input signal, a signal equal and opposite to an interleaving image created by the interleaving DAC, such that the interleaving image is effectively mitigated. Error correction control parameters can be periodically adjusted for changes in temperature by a controller coupled to an on-chip temperature sensor.

SUMMARY

It is in view of the above considerations and others that the various embodiments of this disclosure have been made. The present disclosure therefore recognizes the fact that there is a need for improvement of the existing art described above.

It is a general object of the embodiments described herein to provide a new type of digital to analog converter (DAC) which is improved over prior art and which eliminates or at least mitigates the drawbacks discussed above. More specifically, an object of the embodiments of the invention described herein is to provide a time-interleaved DAC (TI-DAC) that has reduced sensitivity to data timing and current cell settling providing an improved spurious free dynamic range (SFDR). These objects are achieved by the technique set forth in the appended independent claims with preferred embodiments defined in the dependent claims related thereto.

In a first aspect, a time-interleaved current-steering digital to analog converter (TI-IDAC) is presented. The TI-IDAC comprises a first sub-DAC, a second sub-DAC, a load switch and an interleaving switch arranged between the sub-DACs and the load switch. The interleaving switch is configured to interleave between the sub-DACs by control of a connection between the first sub-DAC and an input port of the load switch, and control of a connection between the second sub-DAC and the input port of the load switch. Further to this, the load switch is configured such that the input port of the load switch is connected to a reset load of the TI-IDAC at least when the interleaving switch changes at least one of the connections between the sub-DACs and the input port of the load switch.

In one variant, the load switch is configured to connect the input port of the load switch to either the reset load or an output load. This is beneficial as it allows the SUB-DACs to be continuously loaded avoiding current transients etc.

In one variant, the interleaving switch is configured to control the connection between the first sub-DAC and the input port of the load switch by a second interleaving signal, and the connection between the second sub-DAC and the input port of the load switch by a first interleaving signal. The first interleaving signal and the second interleaving signal are configured to overlap in time by an overlap period. The overlap period is beneficial as it ensures there is always a current flowing through the sub-DACs which stabilizes the operating points of the sub-DACs.

In one variant, a first data signal is provided to the first sub-DAC controlled by a first data latching clock signal, and a second data signal is provided to the second sub-DAC controlled by a second data latching clock signal being an inverse of the first data latching clock signal.

In one variant, the first interleaving clock signal, the second interleaving clock signal and the first data latching clock operate at a same frequency. In addition to this, the first data latching clock signal is phase shifted with regards to both the first interleaving clock signal and the second interleaving clock signal.

In one variant, the interleaving switch is configured, by the interleaving clock signals, to connect each of the sub-DACs to either the input port of the load switch or to an interleaving load. This is beneficial as it allows the sub-DACs to be continuously loaded and thereby reducing current transients etc. caused by switching of the sub-DACs.

In one variant, the reset load is one of a resistor, a diode connected transistor or a current mirror.

In one variant, the interleaving load and the reset load are identical. This is beneficial as it allows the sub-DACs to be continuously loaded with similar loads avoiding current transients etc.

In one variant, a current mirror is connected between the load switch and the output load. The current mirror is configured to mirror a current of the load switch into the output load. This is beneficial as voltage swing across the TI-IDAC may be reduced and it is possible to add a gain compensating any loss in output signal occurring due to the interleaving.

In one variant, the first data signal is provided from a main data signal via a first data flip flop of the TI-IDAC latched by the first data latching clock signal. The second data signal is provided from the main data signal via a second data flip flop of the TI-IDAC latched by the second data latching clock signal. The use of data flip flops is beneficial as it allows the first and second data signals to be latched at a point in time that is optimal from a performance perspective of the TI-IDAC.

In one variant, the first sub-DAC and the second sub-DAC are calibrated to be equal in gain and offset. This is beneficial as it reduced a risk of mismatch between the sub-DACs.

In one variant, the TI-IDAC further comprises a third sub-DAC and wherein the interleaving switch is further configured to interleave between the sub-DACs by control of a connection between the third sub-DAC and an input port of the load switch by a third interleaving signal. Using a third sub-DAC may be beneficial as it allows the clocking speed of each sub-DAC to be further reduced.

In one variant, each of the sub-DACs comprises one or more DAC cells. This is beneficial as it enables the conversion of more than one bit at a time.

In a second aspect, an integrated circuit (IC) comprising a TI-IDAC according to the first aspect is presented.

In a third aspect, an electronic equipment comprising a TI-IDAC according to the first aspect is presented.

In one variant, the electronic equipment is a network node.

In one variant, the network node is a base station (BS) of a wireless communications network.

In one variant, the electronic equipment is a wireless device.

In one variant, the wireless device is a user equipment (UE) of a wireless communications network.

In a fourth aspect, a method of controlling a TI-IDAC is presented. The TI-IDAC comprises a first sub-DAC, a second sub-DAC, a load switch and an interleaving switch arranged between the sub-DACs and the load switch. The interleaving switch is configured to interleave between the sub-DACs by control of a connection between the sub-DACs and an input port of the load switch. The load switch is configured to connect the input port of the load switch to either a reset load or an output load. The method comprises controlling the load switch to connect the input port of the load switch to the reset load. Subsequent to this, the method comprises controlling the interleaving switch to connect the first sub-DAC to the input port of the load switch and to disconnect the second sub-DAC from the input port of the load switch. Further and subsequently to this, the method comprises controlling the load switch to connect the input port of the load switch to the output load.

In one variant, controlling the interleaving switch to connect the first sub-DAC to the input port of the load switch and to disconnect the second sub-DAC from the input port of the load switch, further comprises delaying, for an overlap period, between controlling the interleaving switch to connect the first sub-DAC to the input port of the load switch and controlling the interleaving switch to disconnect the second sub-DAC from the input port of the load switch. This is beneficial as it allows the SUB-DACs to be continuously loaded avoiding current transients etc.

In one variant, the method further comprises, subsequent to controlling the interleaving switch such that the second sub-DAC is disconnected from the input port, updating a second data signal provided to the second sub-DAC. This is beneficial as the second data signal is updated when the second sub-DAC is disconnected from the output load which removes the risk of transients or glitches at the output load due to an updated second data signal.

In one variant, the method further comprises, after controlling the load switch to connect the first sub-DAC to the output load, controlling the load switch to connect the input port of the load switch to the reset load. Subsequent to this, the method comprises controlling of the interleaving switch to connect the second sub-DAC to the input port of the load switch and to disconnect the first sub-DAC from the input port of the load switch. Subsequent to this, the method comprises controlling of the load switch to connect the input port of the load switch to the output load.

In one variant, controlling the interleaving switch to connect the second sub-DAC to the input port of the load switch and to disconnect the first sub-DAC from the input port of the load switch, further comprises delaying, for an overlap period. The delaying is performed between controlling the interleaving switch to connect the second sub-DAC to the input port of the load switch and controlling the interleaving switch to disconnect the first sub-DAC from the input port of the load switch. This is beneficial as it allows the sub-DACs to be continuously loaded avoiding current transients etc.

In one variant, the method further comprises, subsequent to controlling of the interleaving switch such that the first sub-DAC is disconnected from the input port, updating a first data signal provided to the first sub-DAC. This is beneficial as the first data signal is updated when the first sub-DAC is disconnected from the output load which removes the risk of transients or glitches at the output load due to an updated first data signal.

In one variant, the TI-IDAC is the TI-IDAC according to the first aspect.

In a fifth aspect, a computer program is presented. The computer program comprises instructions which, when executed by a controller connected to the TI-IDAC according to the first aspect, cause the controller to carry out the method according to the fourth aspect.

In a sixth aspect, a carrier comprising the computer program of the fifth aspect is presented. The carrier is one of an electronic signal, an optical signal, a radio signal, or a computer readable storage medium.

BRIEF DESCRIPTION OF THE DRAWINGS

These and other aspects, features and advantages will be apparent and elucidated from the following description of various embodiments; references being made to the appended diagrammatical drawings which illustrate non-limiting examples of how the concept can be reduced into practice.

DETAILED DESCRIPTION

Hereinafter, certain embodiments will be described more fully with reference to the accompanying drawings. The teachings herein may, however, be embodied in many different forms and should not be construed as limited to the embodiments set forth herein; rather, these embodiments are provided by way of example so that this disclosure will be thorough and complete, and will fully convey the scope as it is defined in the appended claims, to those skilled in the art.

The term “coupled” is defined as connected, although not necessarily directly, and not necessarily mechanically. Two or more items that are “coupled” may be integral with each other. The terms “a” and “an” are defined as one or more unless this disclosure explicitly requires otherwise. The terms “substantially,” “approximately,” and “about” are defined as largely, but not necessarily wholly what is specified, as understood by a person of ordinary skill in the art. The terms “comprise” (and any form of comprise, such as “comprises” and “comprising”), “have” (and any form of have, such as “has” and “having”), “include” (and any form of include, such as “includes” and “including”) and “contain” (and any form of contain, such as “contains” and “containing”) are open-ended linking verbs. As a result, a method that “comprises,” “has,” “includes” or “contains” one or more steps possesses those one or more steps, but is not limited to possessing only those one or more steps.

In the following, a digital to analog converters (DAC) is to mean a DAC device, circuitry or module configured to receive digital data and output an analog representation of the received digital data. The digital data is provided as one or more bits and may be configured to form a digital word. Current-steering DACs (IDACs) are DACs that provide their output as a current, generally the current is available across a load of the IDAC that may or may not be comprised in the IDAC. A DAC cell is a subset of a DAC configured to provide an analog output corresponding to a subset of the received digital data. To exemplify, a 12-bit DAC may be composed of 12 DAC cells, each configured to receive one bit and output an analog (current) representation of that bit. The outputs of the DAC cells are combined within the DAC to form one analog signal as an output signal of the DAC. A time-interleaved DAC (TI-DAC) or time-interleaved current-steering DAC (TI-IDAC) is a DAC comprising two or more sub-DACs whose outputs are interleaved by the TI-DAC to form the output of the TI-DAC. Each sub-DAC comprises one or more DAC cells and if removed from the TI-DAC, a sub-DAC is substantially a DAC.

Figure 1:
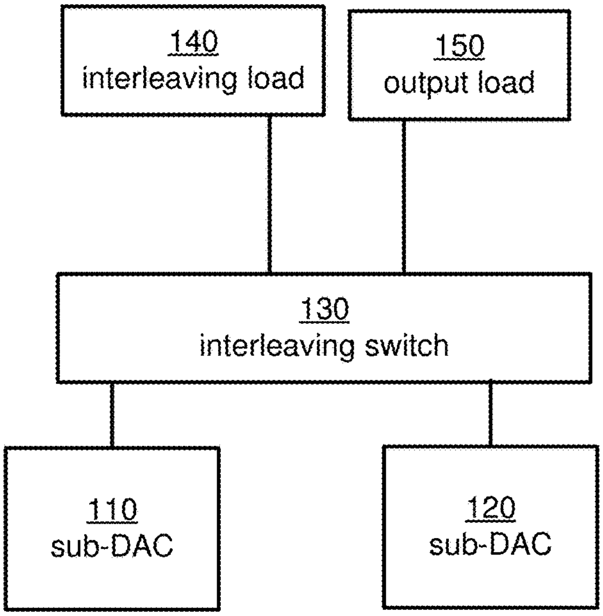
Fig. 1 Prior art
FIG. 1 is time-interleaved digital to analog converter according to the prior art.

The present disclosure relates to digital to analog converters DACs, and more precisely to IDACs and even more precisely to TI-IDACs. In FIG. 1, a prior art TI-IDAC is illustrated and this will be referenced when describing the general operation of a TI-IDAC. The prior art TI-IDAC comprises a first sub-DAC 110 and a second sub-DAC 120. An interleaving switch 130 to the prior art TI-IDAC is configured to multiplex between the sub-DACs 110, 120 such that one sub-DAC 110, 120 at a time is connected to an output load 150 of the prior art TI-IDAC. As the TI-IDAC operate in current mode, it is beneficial to always have a current flowing through each of the sub-DACs 110, 120 to ensure a stable operating points of the sub-DACs 110, 120 and to avoid other performance degradations. This may be accomplished by configuring the interleaving switch 130 to connect the (one or more) sub-DACs 110, 120 currently not connected to the output load 150, to an interleaving load 140 of the prior art TI-IDAC. The interleaving load 140 is preferably similar to the output load 150, more preferably identical to the output load 150.

To exemplify, initially the interleaving switch 130 is configured such that the first sub-DAC 110 is connected to the interleaving load 140 and the second sub-DAC 120 is connected to the output load 150. At a next edge of a full rate clock CLK (visible in FIG. 4), both sub-DACs 110, 120 are connected to both the output load 150 and the interleaving load 140 to ensure current flowing through each sub-DAC 110, 120. Shortly after, the interleaving switch 130 is updated such that the first sub-DAC 110 is only connected to the output load 150, i.e. the first sub-DAC 110 is disconnected from the interleaving load 140, and the second sub-DAC 120 is connected only to the interleaving load 140, i.e. the second sub-DAC 120 is disconnected from the output load 150. Next, the second sub-DAC 120 is updated with the next data sample, e.g. next digital word, as input. By updating the input of a sub-DAC 110, 120 when it is not connected the output load 150, any data timing error or current cell settling error does not directly propagate to the output load 150. Such errors are propagated to the interleaving load 140 instead and not visible at the output load 150. For this reason, the time-interleaved DAC is much less sensitive to timing and settling errors, caused e.g. by digital data timing errors, compared with a DAC operating at full rate.

Drawbacks of time-interleaving (well-known also for analog to digital converters) is that the sub-DACs 110, 120 are preferably designed to match in offset, gain and time. Offset may be corrected with a parallel DAC per sub-DAC 110, 120 to cancel the offset. Gain may be corrected by individually adjusting reference voltages for the sub-DACs 110, 120. Timing errors refer to the transition of switches controlling latching of the interleaving switch 130. The rising and falling edge of signal controlling the latching of the interleaving switch 130 may need to be matched with high accuracy (in the pico-second range) in order to reach a high spurious free dynamic range (SFDR). These constraints are very challenging to guarantee across process, voltage and temperature. This becomes even more challenging when more than two sub-DACs 110, 120 are interleaved, increasing the number of ports and switching devices of the interleaving switch 130. Further to this, TI-IDACs are sensitive to the duty cycle of the clocks performing the interleaving operation.

The majority of power in high speed TI-IDACs is consumed by the digital logic required to meet these stringent timing requirements.

The inventors behind the present invention has, through substantial inventive thinking realized that the negative effects of time-interleaving may be addressed by using return-to-zero (RZ or RTZ) techniques when implementing a TI-IDAC according to the present disclosure.

Historically, RZ IDACs, not TI-IDACs, are used to mitigate timing skew in clocking data between DAC-cells of the IDAC. These additional RZ switches are added to the output path between one or more of the DAC-cells and a load of the IDAC. Generally, the RZ switches (not shown) are switched off for one-half of the clock period while the data to the DAC-cells changes and is then switched back on after the currents have settled. This effectively reduces the timing skew between the various DAC-cells. However, due to the switching off for one-half of the clock period, one negative effect is a loss of one-half of the signal amplitude, 6 dB, due to this return-to-zero architecture. RZ DACs are less sensitive to timing of the digital data, assuming data is updated during the RZ operation. The current cell settling is not significantly relaxed because there is only a half clock cycle for it to settle before the cell is actively used in the IDAC again. The drawback is that a pulse controlling the RZ switches is preferably wide enough to include all timing mismatch across the whole array of DAC-cells thereby reducing the output amplitude accordingly.

Figure 2A:
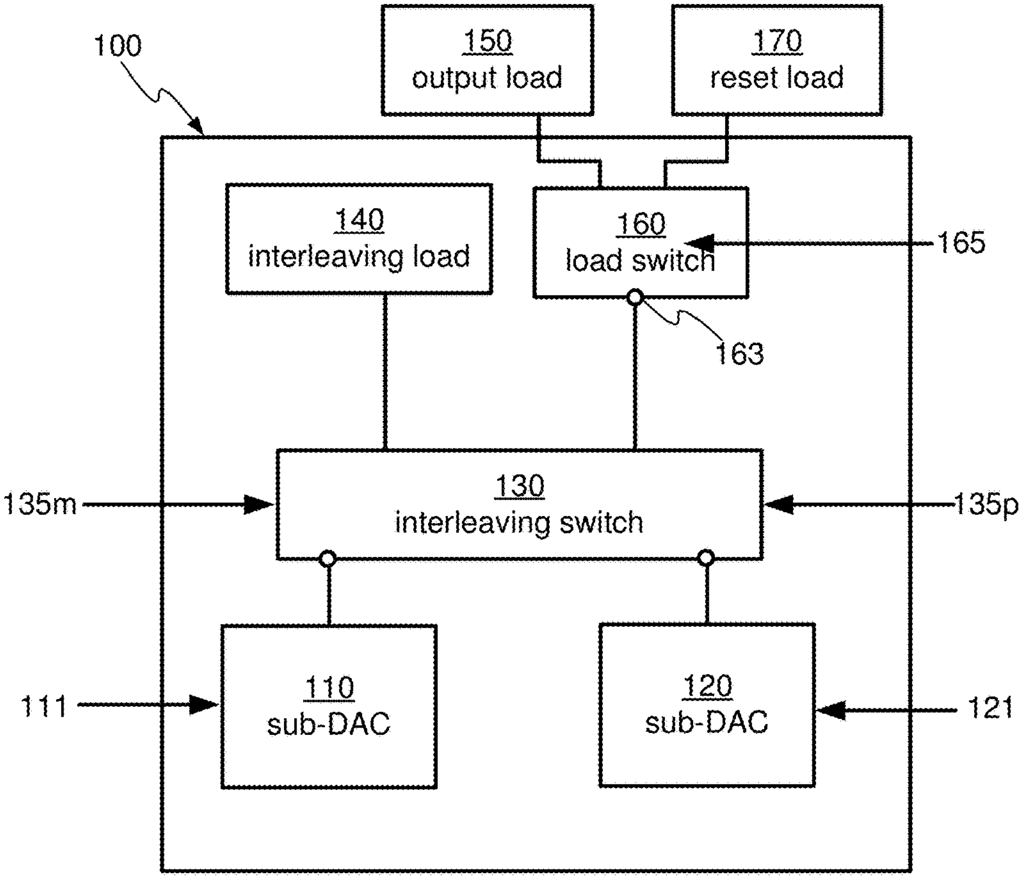
FIGS. 2*a-b* are block diagrams of embodiments of a time-interleaved current-steering digital to analog converter according to embodiments the present disclosure.

FIG. 2*a* is a block diagram of a TI-IDAC 100 according to one embodiment. The TI-IDAC 100 comprises a first sub-DAC 110 and a second sub-DAC 120. The sub-DACs 110, 120 are connected to an interleaving switch 130 of the TI-IDAC 100. The interleaving switch 130 is further connected to an input port 163 of a load switch 160 of the TI-IDAC 100. The interleaving switch 130 is configurable to form an operative connection between the input port 163 of the load switch 160 and one or both of the first sub-DAC 110 and the second sub-DAC 120. In other words, the interleaving switch 130 may be configured to interleave between the sub-DACs 110, 120 by control of a connection between the first sub-DAC 110 and the input port 163 of the load switch 160, and control of a connection between the second sub-DAC 120 and the input port 163 of the load switch 160. The load switch 160 may be configured such that its input port 163 is connected to a reset load 170 at least when the interleaving switch 130 changes at least one of the connections between the sub-DACs 110, 120 and the input port 163 of the load switch 160. In other words, when the interleaving switch 130 changes states, i.e. makes changes to the input port of the load switch 160, the load switch 160 is connected to the reset load 170.

By configuring and controlling the interleaving switch 130 and the load switch 160 as introduced above, sensitivity to data timing and current cell settling of the TI-IDAC is greatly reduced. This in turn significantly increases the SFDR of the TI-IDAC. In addition to this, the configuration significantly reduces, or even removes, the above-mentioned picosecond timing requirements of the signals controlling the latching of the interleaving switch 130. Further to this, the total power and area of all sub-DACs 110, 120 may be reduced since their timing and settling requirements are scaled down. This makes the TI-IDAC more power and area efficient compared to one single IDAC operating at full speed.

The load switch 160 may be described as an RZ switch cascaded such that it is common to all sub-DACs 110, 120, not only DAC cells 110*a*, 110*b*, 110*c*, 120*a*, 120*b*, 120*c* (see FIG. 5) of one sub-DAC 110, 120. RZ operation is performed during the interleaving operation, i.e. when the interleaving switch 130 changes at least one of the connections between the sub-DACs 110, 120 and the input port 163 of the load switch 160. That is to say, the TI-IDAC 100 according to the present disclosure is preferably disconnected from the output load 150 and connected to a reset load 170 for a short time when swapping from one sub-DAC 110, 120 to the next sub-DAC 110, 120. By doing so, any mismatch in the timing of the interleaving switch 130 is masked, e.g. not visible at the output load 150. This significantly reduces the extreme timing requirements of the time-interleaving switches and makes it viable to use TI-IDACs also for high bandwidth operation. Further to this, as the load switch 160 is controlled to compensate for the switching of the interleaving switch 130 and not, as in the prior art, the digital data, a time that the load switch 160 is connected to the reset load 170 may be much shorter compared to that of prior art RZ switching thereby reducing a loss in output current due to the RZ switching.

With continued reference to FIG. 2*a*, as mentioned, the interleaving switch 130 is configurable to form an operative connection between the input port 163 of the load switch 160 and one or both of the first sub-DAC 110 and the second sub-DAC 120. The control of the operative connection between the input port 163 of the load switch 160 and the second sub-DAC 120 may be controlled by a first interleaving signal 135*m*. The first interleaving signal 135*m* is preferably further configured to control an operative connection between first sub-DAC 110 and the interleaving load 140. The control of the operative connection between the input port 163 of the load switch 160 and the first sub-DAC 110 may be controlled by a second interleaving signal 135*p*. The second interleaving signal 135*p* is preferably further configured to control an operative connection between the second sub-DAC 120 and the interleaving load 140. Additionally, or alternatively, a load switch signal 165 may be utilized to control the load switch 160. That is to say, the load switch signal 165 may be configured to control whether the input port 163 of the load switch 160 is connected to the reset load 170 or to the output load 150. Additionally, or alternatively, the first sub-DAC 110 may be configured to receive a first data signal 111 whose analog representation is provided to the interleaving switch 130. Correspondingly, the second sub-DAC 120 may be configured to receive a second data signal 121 whose analog representation is provided to the interleaving switch 130. The connection and control of these signals is further illustrated in FIGS. 5 and 6.

Figure 2B:
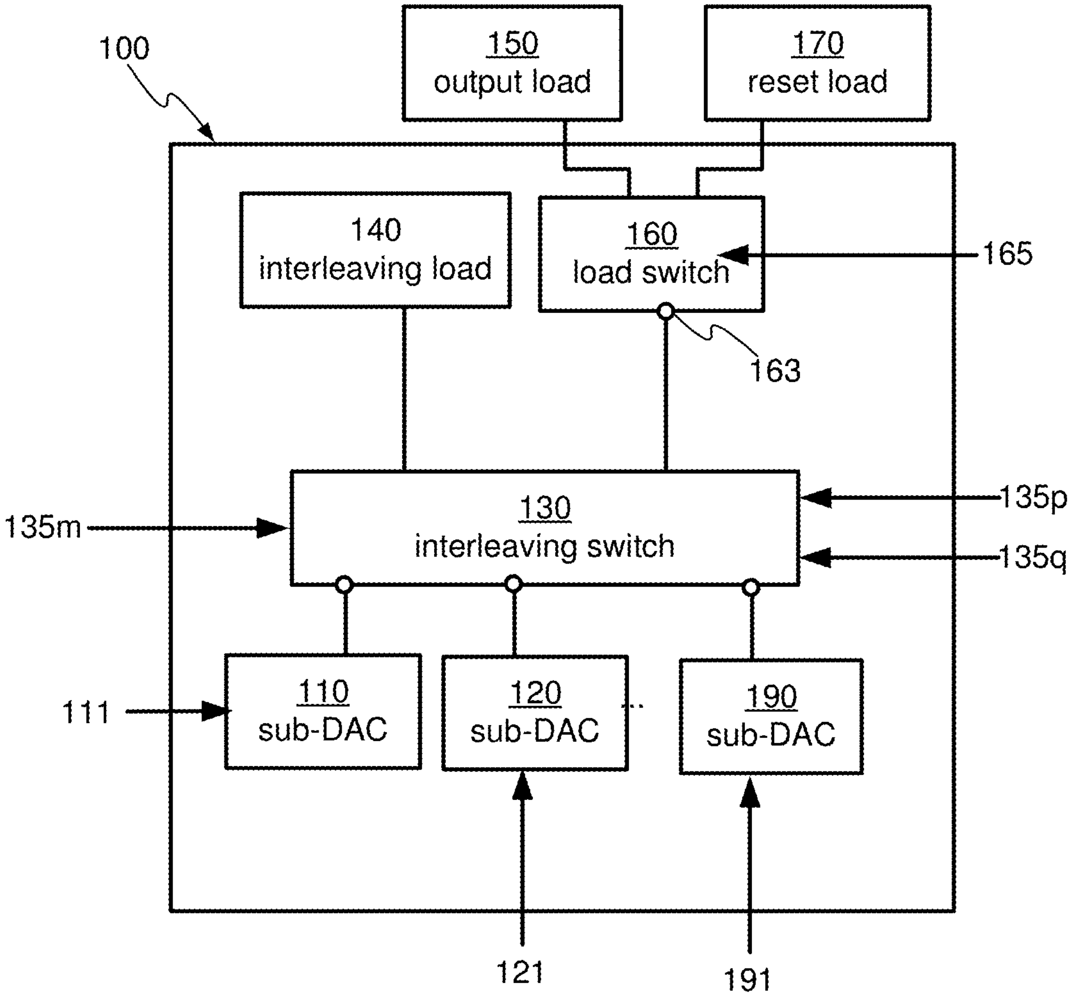

Turning briefly to FIG. 2*b*, a further embodiment of a TI-IDAC 100 according to the present disclosure is presented. The main difference between the TI-IDAC 100 of FIG. 2*b* and the TI-IDAC of FIG. 2*a* is that the TI-IDAC of FIG. 2*b* comprises more than two sub-DACs. The TI-IDAC 100 of FIG. 2*b* is shown comprising a first sub-DAC 110, a second sub-DAC 120 and a third sub-DAC 190. The TI-IDAC 100 of FIG. 2*b* is configured correspondingly to the TI-IDAC 100 of FIG. 2*a*. That is to say, the sub-DACs 110, 120, 190 are connected to the interleaving switch 130 of the TI-IDAC 100. The interleaving switch 130 is further connected to the input port 163 of the load switch 160 of the TI-IDAC 100. The interleaving switch 130 is configurable to form an operative connection between the input port 163 of the load switch 160 and one, two or all of the first sub-DAC 110, the second sub-DAC 120 and the third sub-DAC 190. In other words, the interleaving switch 130 may be configured to interleave between the sub-DACs 110, 120, 190 by control of a connection between the first sub-DAC 110 and the input port 163 of the load switch 160, control of a connection between the second sub-DAC 120 and the input port 163 of the load switch 160, and control of a connection between the third sub-DAC 190 and the input port 163 of the load switch 160. The load switch 160 may be configured such that its input port 163 is connected to a reset load 170 at least when the interleaving switch 130 changes at least one of the connections between the sub-DACs 110, 120, 190 and the input port 163 of the load switch 160. In other words, when the interleaving switch 130 changes states, i.e. makes changes to the input port of the load switch 160, the load switch 160 is preferably connected to the reset load 170.

Corresponding to the TI-IDAC 100 of FIG. 2*a*, the TI-IDAC 100 of FIG. 2*b*, is preferably configured such that the control of the operative connection between the input port 163 of the load switch 160 and the first sub-DAC 110 may be controlled by a second interleaving signal 135*p*. The control of the operative connection between the input port 163 of the load switch 160 and the second sub-DAC 120 may be controlled by a first interleaving signal 135*m*. The control of the operative connection between the input port 163 of the load switch 160 and the third sub-DAC 190 may be controlled by a third interleaving signal 135*q*. Additionally, or alternatively, a load switch signal 165 may be utilized control the load switch 160. Additionally, or alternatively, the first sub-DAC 110 may be configured to receive a first data signal 111 whose analog representation is provided to the interleaving switch 130. Correspondingly, the second sub-DAC 120 may be configured to receive a second data signal 121 whose analog representation is provided to the interleaving switch 130 and the third sub-DAC 190 may be configured to receive a third data signal 191 whose analog representation is provided to the interleaving switch 130.

For the sake of efficient disclosure, future references and embodiments will typically be made to TI-IDACs configured with two sub-DACs 110, 120 but as is readily understood by the skilled person after digesting the teachings of this disclosure; any plurality of sub-DACs may be used when designing a TI-IDAC 100 in accordance with the present disclosure. In other words, the present disclosure is not limited to TI-IDACs 100 comprising two or three sub-DACs 110, 120, 190 but is equally applicable to any number of sub-DACs>1.

Figure 3:
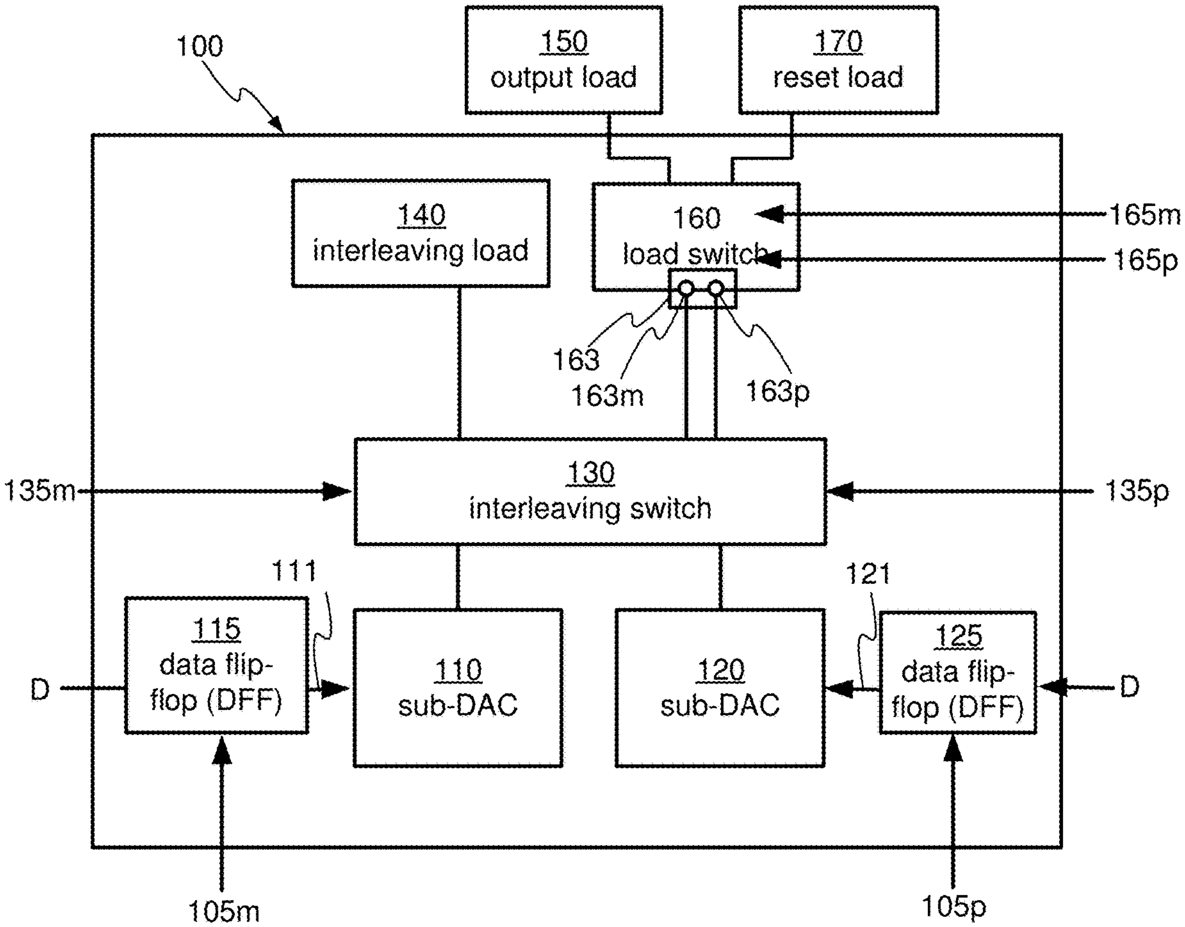
FIG. 3 is a block diagram of embodiments of a time-interleaved current-steering digital to analog converter according to embodiments the present disclosure.

In FIG. 3, an embodiment of the TI-IDAC 100 according to the present disclosure is illustrated. In this embodiment, the TI-IDAC 100 comprises, in addition to that of the TI-IDAC of FIG. 2*a*, a first data flip flop (DFF) 115 and a second DFF 125. The first DFF 115 may be configured to provide the first data signal 115 to the first sub-DAC 110 by latching a main data signal D by a first data latching clock 105*m*. The second DFF 125 may be configured to provide the second data signal 125 to the second sub-DAC 110 by latching the main data signal D by a second data latching clock 105*p*. The first data latching clock 105*m* and the second data latching clock 105*p* may be comprised in a data latching clock 105 (see FIG. 4). Using DFFs 115, 125 is beneficial as it relaxes requirements related to data path timing as the DFFs 115, 125 will effectively re-time the main data signal D. The DFFs 115, 125 are preferably configured to update the data signals 111, 121 to reflect what is provided to the DFF 115, 125 by the main data signal D when the latching clock signal 105*m*, 105*p* is triggered. To exemplify, if a TI-IDAC 100 comprising two sub-DACs 110, 120 is provided, and the main data signal D is clocked by the full rate clock CLK, the latching clock signals 105*m*, 105*p* are preferably configured to provide every second sample of the main data signal D to the first sub-DAC 110 and the other samples of the main data signal D to the second sub-DAC cell 120. As a result, the latching clock signals 105*m*, 105*p* are preferably configured with a frequency that is half the frequency of the full rate clock CLK.

The load switch 160 of FIG. 3 is, in this embodiment shown with additional details compared to the load switches 160 of FIGS. 2*a* and 2*b*. The input port 163 of the load switch 160 in FIG. 160 comprises a first input port 163*m* and a second input port 163*p*. A first load switch signal 165*m* may be provided to the load switch 160 in order to control an operative connection from the first input port 163*m* to the output load 150. A second load switch signal 165*p* may be provided to the load switch 160 in order to control an operative connection from the second input port 163*p* to the reset load 170. The connection between the interleaving switch 130 and the load switch 160 is such that both the first sub-DAC 110 and the second sub-DAC 120 may be connected to either of the first input port 163*m* or the second input port 163*p* of the load switch 160. It should be mentioned that this configuration of the load switch 160 is possible to use also with the TI-IDACs 100 of FIGS. 2*a* and 2*b*.

Figure 4:
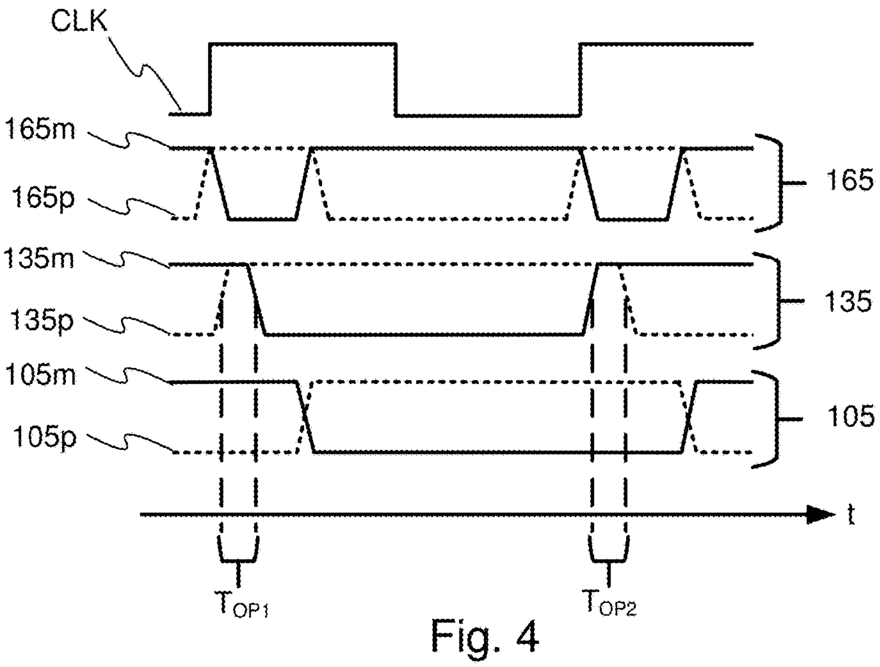
FIG. 4 is a timing diagram of control of a time-interleaved current-steering digital to analog converter according to embodiments the present disclosure.

With reference to FIG. 4, the timing of the control signals of the TI-IDAC 100 in FIG. 3 will be further explained. FIG. 4 is a graph illustrating the full rate clock signal CLK, the first load switch signal 165*m*, the second load switch signal 165*p*, the first interleaving signal 135*m*, the second interleaving signal 135*p*, the first data latching clock signal 105*m* and the second data latching clock signal 105*p*, all aligned along a common time axis t. The signals in FIG. 4 are configured such that a high signal controls a corresponding connection, e.g. a transistor switch, to a closed state, i.e. the connection is conducting. Correspondingly, a low signal controls the corresponding connection to an open state, i.e. the connection is not conducting.

In the exemplary scenario illustrated in FIG. 4, the output load 150 of the TI-IDAC 100 is initially connected to the second sub-DAC 120. In the following it will be described how the TI-IDAC 100 is controlled to switch to operatively connect the output load 150 to the first sub-DAC 110 and then back to the second sub-DAC 120. In the following, the phrases "synchronously" and "simultaneously" are used and this may be interpreted as "at a same time", but may also be interpreted as "synchronous with an offset". The latter is generally to mean that something happens slightly earlier or later. In examples with two signals of opposite phase changing state synchronously, this may be interpreted as one of the signals being configured to change state slightly earlier than the other in order to create an overlap between the signals. As described elsewhere in the present disclosure, such overlaps may be beneficial to ensure that a current is flowing uninterrupted.

When the full rate clock signal CLK goes high for the first time, i.e. when a consecutive digital word is presented on the main data signal D, the first load switch signal 165*m* goes low. This disconnects the input port 163 of the load switch 160 from the output load 150 and synchronously, or subsequently, to this, the second load switch signal 165*p* goes high connecting the input port 163 of the load switch 160 to the reset load 170. This means that the TI-IDAC 100 is currently disconnected from the output load 150 and the interleaving switch 130 may be toggled without causing e.g. spurious at the output load 150.

As the second sub-DAC 120 was connected to the output load 150 at the start of the timing diagram, the first interleaving signal 135*m* was already high when the full rate clock signal CLK went high and is left unchanged. However, the second interleaving signal 135*p* goes high synchronously, or consecutively, to the input port 163 of the load switch 160 being connected to the reset load 170. This connects the first sub-DAC 110 to the input port 163 of the load switch 160 and the second sub-DAC to the interleaving load 140. This means that both the first sub-DAC 110 and the second sub-DAC 120 are operatively connected to both the input port 163 of the load switch 160 and also to the interleaving load 140. In other words, all sub-DACs 110, 120 are, at this point in time, operatively connected to the reset load 170 and the interleaving load 140. This ensures that a current keeps flowing through the sub-DACs 110, 120 also when switching the interleaving switch 130 which ensures good operating points for transistors of the sub-DACs 110, 120. This is to avoid interruptions or glitches in the output current of the TI-IDAC and both sub-DACs 110, 120 stay operatively connected to the reset load 170 for a first overlap period $T_{OP1}$.

When the first overlap period $T_{OP1}$ has lapsed, the first interleaving signal 135*m* goes low, disconnecting the second sub-DAC 120 from the input port 163 of the load switch 160 and the first sub-DAC 110 from the interleaving load 140. At this point, only the first sub-DAC 110 is operatively connected to the input port 163 of the load switch 160 and only the second sub-DAC 120 is operatively connected to the interleaving load 140. Synchronously, or subsequently, the first load switch signal 165*m* goes high connecting the input port 163 of the load switch 160 to the output load 150. This operatively connects the first sub-DAC 110 to the output load 150. At this point in the diagram of FIG. 4, the first sub-DAC 110 is operatively connected to the output load 150 and the output load 150 has only been disconnected from the load switch 160 during the time the first load switch signal 165*m* was low. As the second sub-DAC 120 is operatively connected to the interleaving load 140, the second data latching clock signal 105*p* may be triggered to update the second data signal 121 provided to the second sub-DAC 120 without compromising e.g. the SFDR of the TI-IDAC 100.

The second time the full rate clock signal CLK goes high, the process of above is repeated. The second load switch signal 165*p* goes high connecting the input port 163, and thereby the first sub-DAC 110 to the reset load 170, and synchronously to this, the first load switch signal 165*m* goes low disconnecting the first sub-DAC 110 from the output load 150.

Consecutive to this, or simultaneous to this, the interleaving switch 130 is controlled to connect the second sub-DAC 120 to the input port of the load switch 160. This is accomplished by setting the first interleaving signal 135*m* high which further connects the first sub-DAC 110 also to the interleaving load 140.

The second interleaving signal 135*p* is kept at a high state for a second overlap time period $T_{OP2}$. This means that, once more, both the first sub-DAC 110 and the second sub-DAC 120 are connected both to the reset load 170 via the load switch 160 and the interleaving switch 130, and to the interleaving load 140 via the interleaving switch 130. As for the first overlap time period $T_{OP1}$, this is to avoid interruptions or glitches in the output current of the TI-IDAC 100.

At the lapse of the second overlap time $T_{OP2}$, the second interleaving signal 135*p* is set low, disconnecting the second sub-DAC 120 from the interleaving load 140 and disconnecting the first sub-DAC 110 from the load switch 160.

When the second interleaving signal 135*p* is low, the first load switch signal 165*m* is set high simultaneously with, or subsequent to, the second load switch signal 165*p* going low, disconnecting the input 163 of the load switch 160 from the reset load 170 and connecting the input 163 of the load switch 160 to the output load 150. This effectively operatively connects the second sub-DAC 120 to the output load 150. As the first sub-DAC 110 is operatively connected to the interleaving load 140, the first data latching clock signal 105*m* may be raised to update the first data signal 111 provided to the first sub-DAC 110 without compromising e.g. the SFDR of the TI-IDAC 100. At this point in the diagram of FIG. 4, the second sub-DAC 120 is once more operatively connected to the output load 150 and the output load 150 has only been disconnected from the input port 163 of the load switch 160 during the time the first load switch signal 165*m* was low.

As seen from FIG. 4, the RZ operation is aligned in time such that RZ occurs during the time-interleaving operation, i.e. swapping between sub-DACs 110, 120. Controlling a TI-IDAC 100 according to any of the embodiments in this disclosure in accordance with the timing of FIG. 4 will ensure that no updates of the interleaving switch 130 or the sub-DACs 110, 120, 190 affect a sub-DAC 110, 120, 190 currently being operatively connected to the output load 150. In addition to this, a time that no sub-DAC 110, 120, 190 is connected to the output load 150 is much shorter than the corresponding time of prior art TI-IDACs which result in a higher signal amplitude delivered to the output load 150 without increasing current consumption of the TI-IDAC 100. The prior art TI-IDACs would dump substantially half the available output power into the interleaving load 140.

Assume a TI-IDACs with a load switch arranged between each DAC cell and the interleaving switch, rather than between an output of the interleaving switch and the output load as presented herein. All those switches will have slight timing mismatch. Assuming there are two sub-DACs in this exemplary TI-IDAC, the load switches will generally operate at half the full-rate clock rate for each sub-DAC. Consequently, any timing mismatch between the two load switch control signals will give a result at an output of the TI-IDAC that is not periodic on the full rate clock. For example, for every other sample, the pulse on the TI-IDAC output will move and/or has a different duty cycle.

In other words, one benefit of the proposed operation is that the time-interleaving operation occurs when the TI-IDAC 100 is connected to the reset load 170. This way, any timing skew between the first interleaving signal 135*m* and the second interleaving signal 135*p* is not visible at the output load 150. The latching of the data signals 115, 125 may be performed during the ample time that the associated sub-DAC 110, 120, 190 is connected to the interleaving switch 130 further reducing the requirements of timing of e.g. the first data latching signal 105*m* and the second data latching signal 105*p*. The rising and falling edge of a current into the output load 150 is set by timing of the first load switch signal 165*m* and the second load switch signal 165*p*. The first load switch signal 165*m* and the second load switch signal 165*p* are preferably identical each period of the full rate clock CLK. Any timing skew between the first load switch signal 165*m* and the second load switch signal 165*p* will be periodic sample-to-sample and only affects the time for RZ, i.e. the time the sub-DACs 110, 120 are connected to the reset load 170. Consequently, any timing skew between the first load switch signal 165*m* and the second load switch signal 165*p* will mainly affect the signal power at the output load 150 and not introducing any spurs reducing the SFDR.

Figure 5:
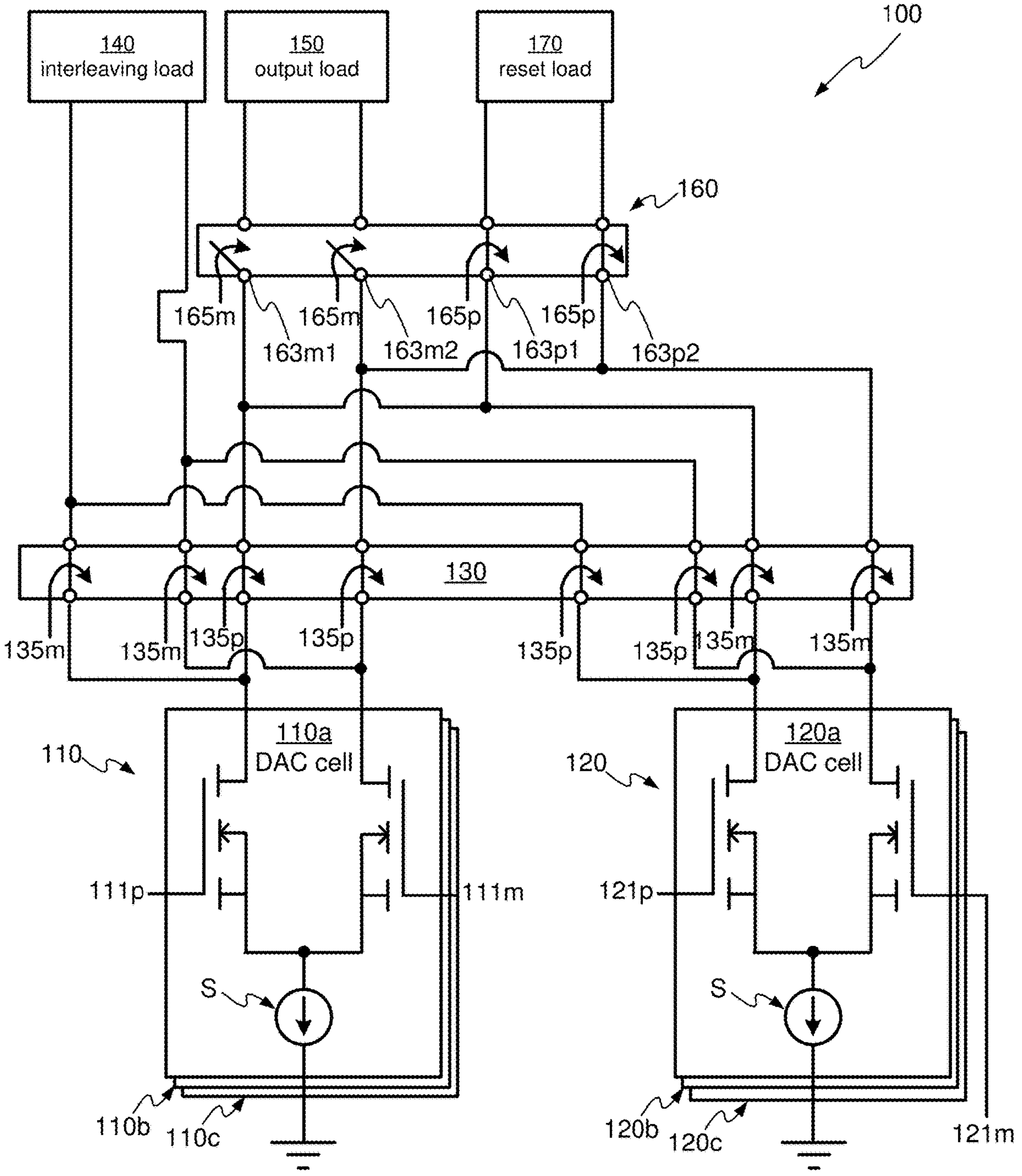
FIG. 5 is a schematic view of embodiments of a time-interleaved current-steering digital to analog converter according to embodiments the present disclosure.

In FIG. 5, a detailed block schematic of the TI-IDAC 100 is shown. The TI-IDAC 100 in FIG. 5 is a differential IDAC which means that the sub-DACs 110, 120 are driven by a positive data signal 111*p*, 121*p* and a negative data signal 111*m*, 121*m* being an inverse of the positive data signal 111*p*, 121*p*. Consequently, the signals between the sub-DACs and the interleaving switch 130, the signals between the interleaving switch 130 and the interleaving load 140 and load switch 160 in addition to the signals between the load switch 160 and the reset load 170 and the output load 150 are doubled forming signal pairs comprising a positive and a negative signal. Differential operation is known to the skilled person and no further explanation is mandated.

As seen in FIG. 5, each of the sub-DACs 110, 120 may comprise a number of DAC cells 110*a*, 110*b*, 110*c*, 120*a*, 120*b*, 120*c*. Each of the DAC cells 110*a*, 110*b*, 110*c*, 120*a*, 120*b*, 120*c* comprises a current source S that, in combination with e.g. dimensioning and control of transistors of the DAC cell 110*a*, 110*b*, 110*c*, 120*a*, 120*b*, 120*c*, determines the weight of the DAC cell 110*a*, 110*b*, 110*c*, 120*a*, 120*b*, 120*c*. Although the embodiment in FIG. 5 is illustrated with the first sub-DAC comprising three DAC cells 110*a*, 110*b*, 110*c* and the second sub-DAC is illustrated comprising three DAC cells 120*a*, 120*b*, 120*c*, this and other embodiments are workable with any number of DAC cells 110*a*, 110*b*, 110*c*, 120*a*, 120*b*, 120*c* in the sub-DACs 110, 120. Preferably, the sub-DACs 110, 120 are identical which implies that all sub-DACs 110, 120 comprise the same number of DAC cells 110*a*, 110*b*, 110*c*, 120*a*, 120*b*, 120*c*.

The interleaving switch 130 is, as seen in FIG. 5, preferably implemented by a series of switches, at least one controlling a connection between each of the signal pairs from the sub DACs 110, 120 and the interleaving load 140 and the load switch 160 respectively. These switches may be any suitable transistor switch. The interleaving between the two sub-DACs 110, 120 of FIG. 5 is controlled by the first interleaving signal 135*m* and the second interleaving signal 135*p*. As illustrated in FIG. 4, these signals 135*m*, 135*p* are preferably controlled to slightly overlap during their on-state to ensure that a current is flowing through the sub-DACs 110, 120 at all times. As previously mentioned, this is to provide a stable operating points for the transistors of the DAC cells 110*a*, 110*b*, 110*c*, 120*a*, 120*b*, 120*c*.

Similarly to the interleaving switch 130, the load switch 160 is preferably implemented by a series of switches, at least one controlling a connection between each of the signal pairs from the interleaving switch 130 and the output load 150 and the reset load 170 respectively. These switches may be any suitable transistor switch. Controlling of the switches connecting of the first input ports 163*m*1, 163*m*2 to the output load 150 is done by the first load switch signal 165*m*. Controlling of the switches connecting of the second input ports 163*p*1, 163*p*2 to the reset load 170 is done by the second load switch signal 165*p*.

As seen in FIG. 5, the outputs of each of the sub-DACs 110, 120 are connected both to switches of the interleaving switch 130 controlling the connection to the interleaving load 140, and also to switches of the interleaving switch 130 controlling the connection to the load switch 160. Signals from the first sub-DAC 110 that are connectable to the interleaving load 140 under control of the first interleaving signal 135*m* are combined with signals from the second sub-DAC 120 that are connectable to the interleaving load 140 under control of the second interleaving signal 135*p*. Correspondingly, signals from the first sub-DAC 110 and the second sub-DAC 120 that are connectable to the load switch 160 are split and connected both to the first input port 163*m*, 163*m*1, 163*m*2 of the load switch 160 and to the second input port 163*p*, 163*p*1, 163*p*2 of the load switch 160.

As the switches are positioned in FIG. 5, the TI-IDAC 100 is currently configured with first interleaving signal 135*m* and the second interleaving signal 135*p* overlapping, i.e. during instances of the first or second overlap periods $T_{OP1}$, $T_{OP2}$.

Figure 6:
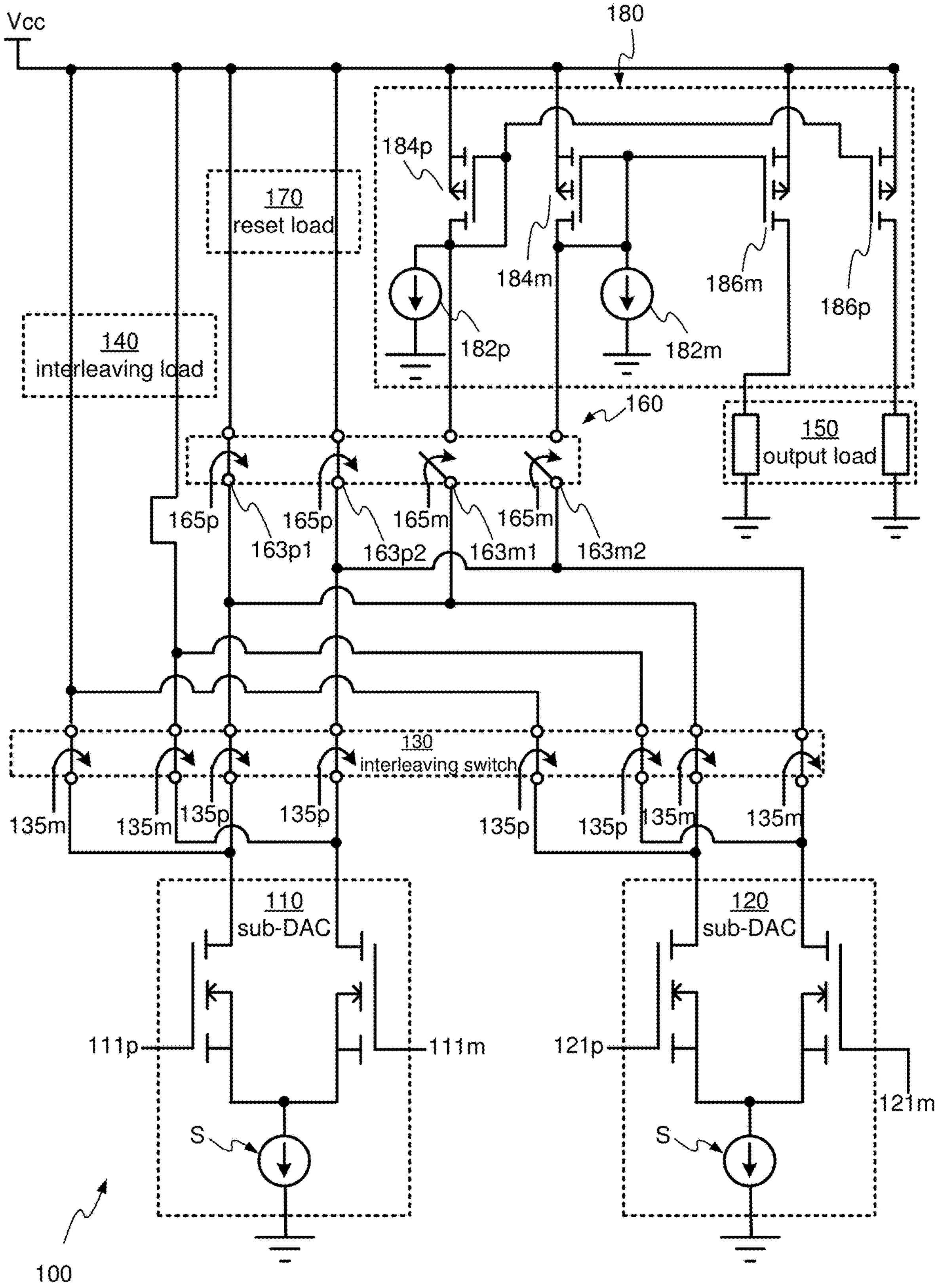
FIG. 6 is a schematic view of embodiments of a time-interleaved current-steering digital to analog converter according to embodiments the present disclosure.

In FIG. 6, another embodiment of the TI-IDAC 100 is shown. In this embodiment, a current mirror 180 is arranged between the load switch 160 and the output load 150. The current mirror 180 is arranged and configured such that a current of the load switch is mirrored into the output load 150. In FIG. 6, this is accomplished by load transistors 184*p*, 184*m* connected to the load switch 160 controlling mirroring transistors 186*m*, 186*p* connected to the output load 150. The current mirror 180 further comprises bias sources 182*m*, 182*p* configured to bias the gates of the load transistors 184*p*, 184*m* and the mirroring transistors 186*m*, 186*p*. As shown in FIG. 6, the TI-IDAC 100 may be connected to a supply voltage Vcc configured and arranged to source power to the TI-IDAC 100. The current mirror 180 will reduce voltage swing across the switches of the TI-IDAC 100 which helps avoid linearity degradation of the TI-IDAC 100. In other words, the diode connected transistor of the current mirror 180 provides a low impedance load for the TI-IDAC 100 and limits the voltage swing across the switches of the TI-IDAC 100.

In one further optional embodiment, the current mirror 180 is configured with a gain to compensate the loss in signal amplitude caused by the short RZ pulse, i.e. the time when the load switch 160 is connected to the reset load 170 and no signal is provided from the load switch 160 to the output load 150.

The load of the load switch 160 may in alternative embodiments be implemented as any suitable current-mode load such as e.g. a folded-cascode circuit.

It should be mentioned that a reduced voltage swing may in principle be obtained with reduced resistor values of the loads 140, 170, 150. However, this may cause implications in stages following the output load 150 as they are likely to incorporate a voltage gain in order to provide sufficient signal level.

Figure 7:
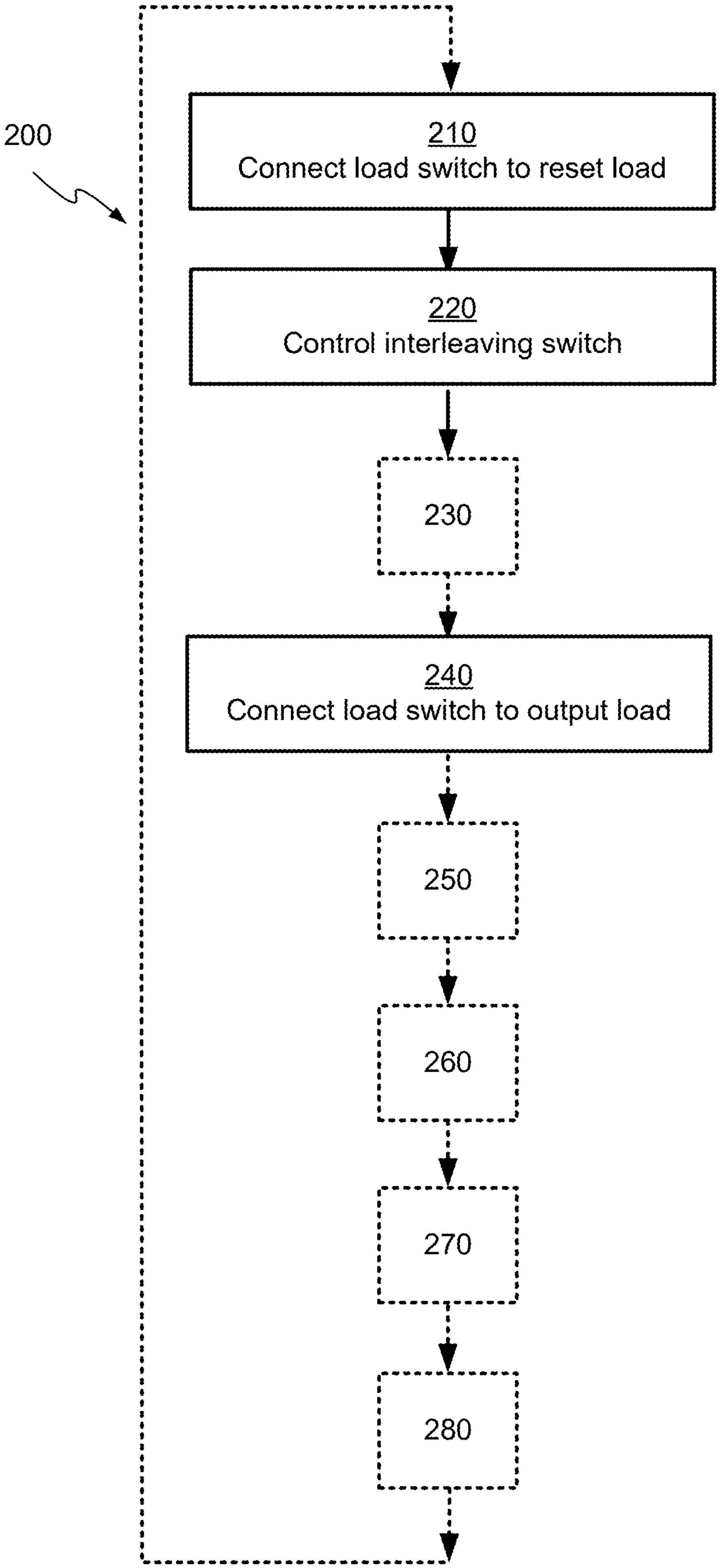
FIG. 7 is a flow chart of a method for controlling a time-interleaved current-steering digital to analog converter according to embodiments the present disclosure.

Based on this disclosure and with reference to FIG. 7, a method 200 for controlling a TI-IDAC 100 will be introduced. The method 200 may be applied to any suitable TI-IDAC 100 incorporating the load switch 160 as exemplified in this disclosure. Preferably, the TI-IDAC 100 comprising two or more sub-DACs 110, 120, 190, the load switch 160 and the interleaving switch 130 arranged and configured in accordance with embodiments presented herein.

The method 200 may be run continuously and, as the skilled person will understand after contemplating e.g. the teachings of FIG. 4, it may be initiated at any step depending on current switch settings etc. For the sake of explanation, the method 200 is assumed to start with the second sub-DAC 120 being operatively connected to the output load 150 via the load switch 150, i.e. the start of the timing diagram of FIG. 4. A first step if the method 200 may comprise controlling 210 of the load switch 160 to connect the input port 163 of the load switch 160 to the reset load 170. This may be done in any suitable manner such as setting the second load switch signal 165*p* high (or low depending on transistor design) as described in this disclosure. The step of controlling 210 of the load switch 160 to connect the input port 163 of the load switch 160 to the reset load 170 may comprise separately, depending on e.g. topology of the load switch 160, disconnecting the load switch 160 from the output load 150. However, the skilled person understands, after reading this disclosure, that the load switch 160 may be configured such that the input port 163 of the load switch 160 may only be connected to one of the output load 150 and the reset load 170 at a time (with the exception of the previously mentioned optional overlap for allowing a continuous current), i.e. the load switch 160 is configured to toggle the input port 163 of the load switch between the output load 150 and the reset load 170. A switch fulfilling this feature may sometimes be referred to as a single input dual throw (SPDT) switch.

This means that all sub-DACs 110, 120, 190 connected to the input port of the load switch 160, are connected to the rest load 170. The method 200 further comprises, subsequently, controlling 220 the interleaving switch 130 to connect the first sub-DAC 110 to the input port 163 of the load switch 160 and to disconnect the second sub-DAC 120 from the input port 163 of the load switch 160. The controlling 220 of the interleaving switch 130 is preferably performed by means of the interleaving signals 135*m*, 135*p*. Optionally, this step of the method may further comprise, see FIG. 8, a step of delaying 225, for a first overlap period $T_{OP1}$. This is analog to the first overlap period $T_{OP1}$ described in reference to FIG. 4. The delaying 225 is performed between a step of controlling 222 the interleaving switch 160 to connect the first sub-DAC 110 to the input port 163 of the load switch 160 and a step of controlling 227 the interleaving switch 160 to disconnect the second sub-DAC 120 from the input port 163 of the load switch 160.

This means that the first sub-DAC 110 is now operatively connected to the input port 163 of the load switch 160 and the second sub-DAC 120 is disconnected from the input port 163 of the load switch 160. The method 200 may optionally further comprise the step of, when the second sub-DAC 120 is disconnected from the input port 163 of the load switch 160, updating 230 the second data signal 121 provided to the second sub-DAC 120. The step of updating 230 the second data signal 121 provided to the second sub-DAC 120 may be performed at any time when the second sub-DAC 120 is disconnected from the output load 150. The second data signal 121 may be updated in any suitable manner and preferably, as described elsewhere in this disclosure, by control of the second data latching clock signal 105*p*.

Subsequently to the step of controlling 220 the interleaving switch 130 to connect the first sub-DAC 110 to the input port 163 of the load switch 160 and to disconnect the second sub-DAC 120 from the input port 163 of the load switch 160, the method 200 further comprises a step of controlling 240 the load switch 160 to connect the input port 163 of the load switch 160 to the output load 150. The controlling 240 of the load switch 160 is preferably performed by control of the load switch signals 165*m*, 165*p*.

In one optional embodiment of the method 200, the step of updating 230 the second data signal 121 provided to the second sub-DAC 120 is performed between the step of controlling 220 the interleaving switch 130 to connect the first sub-DAC 110 to the input port 163 of the load switch 160 and to disconnect the second sub-DAC 120 from the input port 163 of the load switch 160, and controlling 240 the load switch 160 to connect the input port 163 of the load switch 160 to the output load 150.

After controlling 240 the load switch 160 to connect the first sub-DAC 110 to the output load 150, the method 200 may further comprise the optional steps of controlling 250 the load switch 160 to connect the input port 163 of the load switch 160 to the reset load 170. This controlling 250 is preferably performed by control of the load switch signals 165*m*, 165*p*. Subsequent to this, the method 200 may comprise controlling 260 the interleaving switch 130, preferably by means of the interleaving signals 135*m*, 135*p*, to connect the second sub-DAC 120 to the input port 163 of the load switch 160 and to disconnect the first sub-DAC 110 from the input port 163 of the load switch 160. Optionally, this step of the method 200 may further comprise, see FIG. 9, a step of delaying 265, for a second overlap period $T_{OP2}$. This is analog to the second overlap period $T_{OP2}$ described in reference to FIG. 4. The delaying 265 is performed between a step of controlling 262 the interleaving switch 130 to connect the second sub-DAC 120 to the input port 163 of the load switch 160 and a step of controlling 267 the interleaving switch 130 to disconnect the first sub-DAC 110 from the input port 163 of the load switch 160. Further and subsequently to this, the method 200 may comprise controlling 280 of the load switch 160, preferably by the load switch signals 165*m*, 165*p*, to connect the input port 163 of the load switch 160 to the output load 150. This effectively changes the sub-DAC 110, 120 operatively connected to the output load 150 from the first sub-DAC 110 to the second sub-DAC 120.

Similarly to what was described above, the method 200 may optionally further comprise the step of, when the first sub-DAC 110 is disconnected from the input port 163 of the load switch 160, updating 270 the first data signal 111 provided to the first sub-DAC 110. The step of updating 270 the first data signal 111 provided to the first sub-DAC 110 may be performed at any time when the first sub-DAC 110 is disconnected from the output load 150. The first data signal 111 may be updated in any suitable manner and preferably, as described elsewhere in this disclosure, by control of the first data latching clock signal 105*m*. In one further optional embodiment of the method 200, the step of updating 270 the first data signal 111 provided to the first sub-DAC 110 is performed between the step of controlling 260 the interleaving switch 130 to connect the second sub-DAC 120 to the input port 163 of the load switch 160 and to disconnect the first sub-DAC 110 from the input port 163 of the load switch 160, and the step of controlling 280 the load switch 160 to connect the input port 163 of the load switch 160 to the output load 150.

Figure 9:
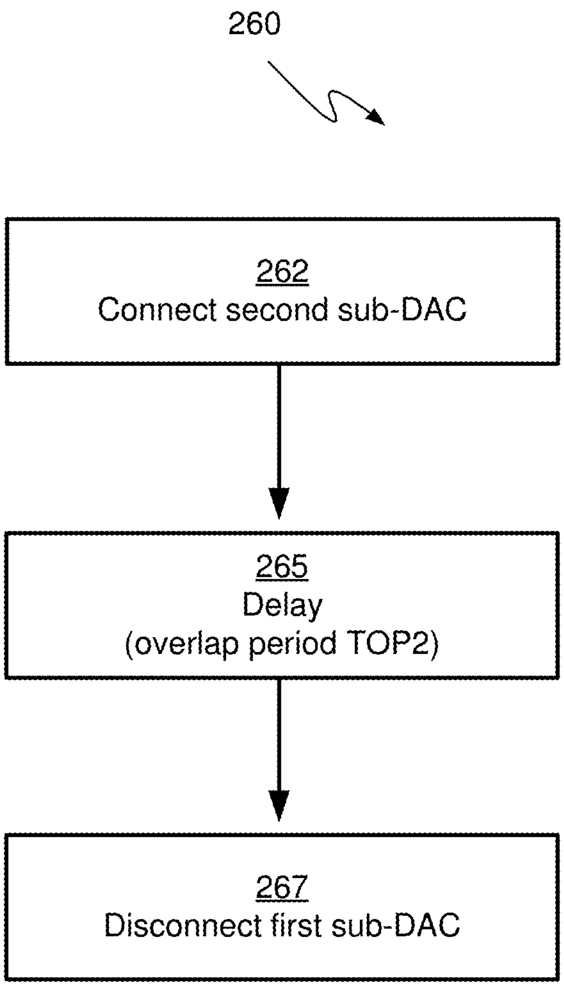
FIG. 9 is a flow chart of part of a method for controlling a time-interleaved current-steering digital to analog converter according to embodiments the present disclosure.
Figure 10:
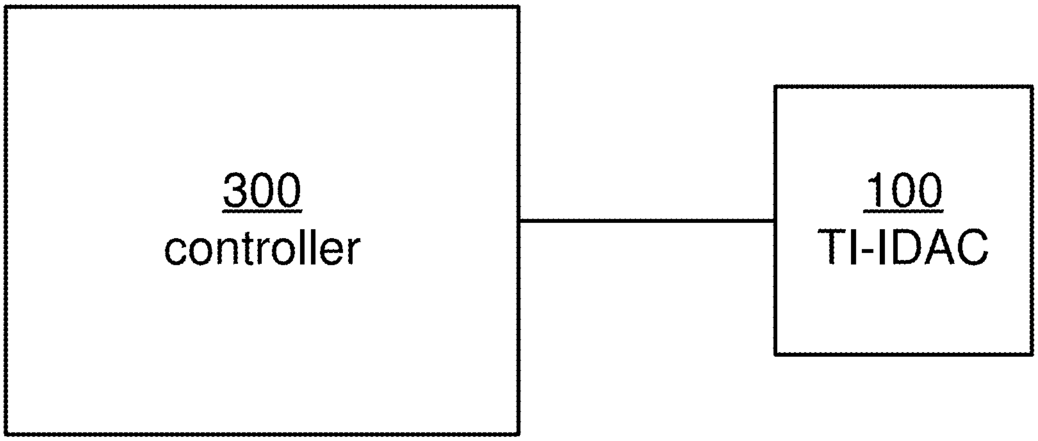
FIG. 10 is a block diagram of a controller according to embodiments the present disclosure.

FIG. 10 schematically illustrates an example controller 300 according to some embodiments. The controller 300 is preferably configured for controlling a TI-IDAC 100 according to embodiments disclosed herein. Embodiments of the controller 300 may be configured to cause performance of (e.g., perform) one or more steps of the method 200 described in connection with FIGS. 7-9.

Figure 11A:
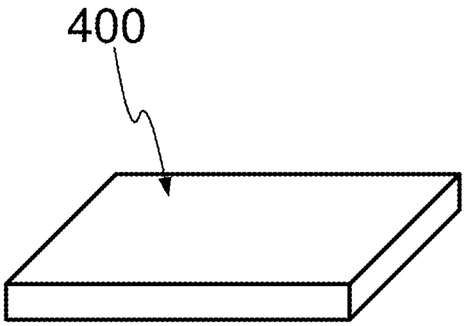
FIGS. 11*a-c* are block diagrams of an integrated circuits according to embodiments of the present disclosure.
Figure 11B:
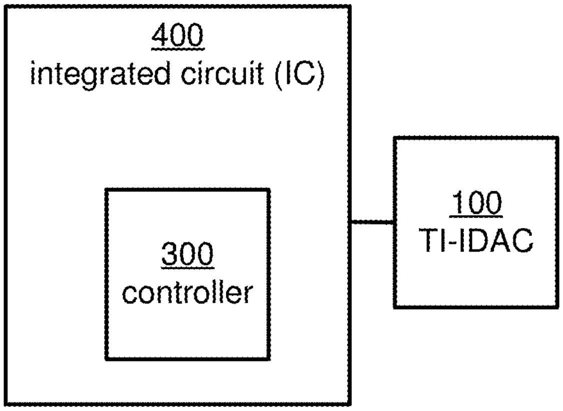
Figure 11C:
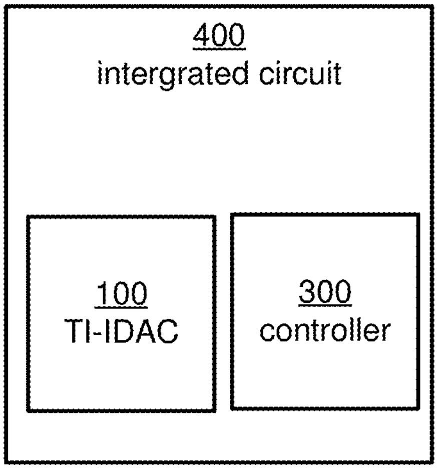

For example, the controller 300 may be comprisable, e.g., comprised, in an integrated circuit (IC) 400, see FIG. 11*a*. The IC 400 may be operatively connected to a TI-IDAC 100 according to embodiments disclosed herein, see FIG. 11*b*. Alternatively, as illustrated in FIG. 11*c*, the IC 400 may comprise a TI-IDAC 100 according to embodiments disclosed herein.

Figure 8:
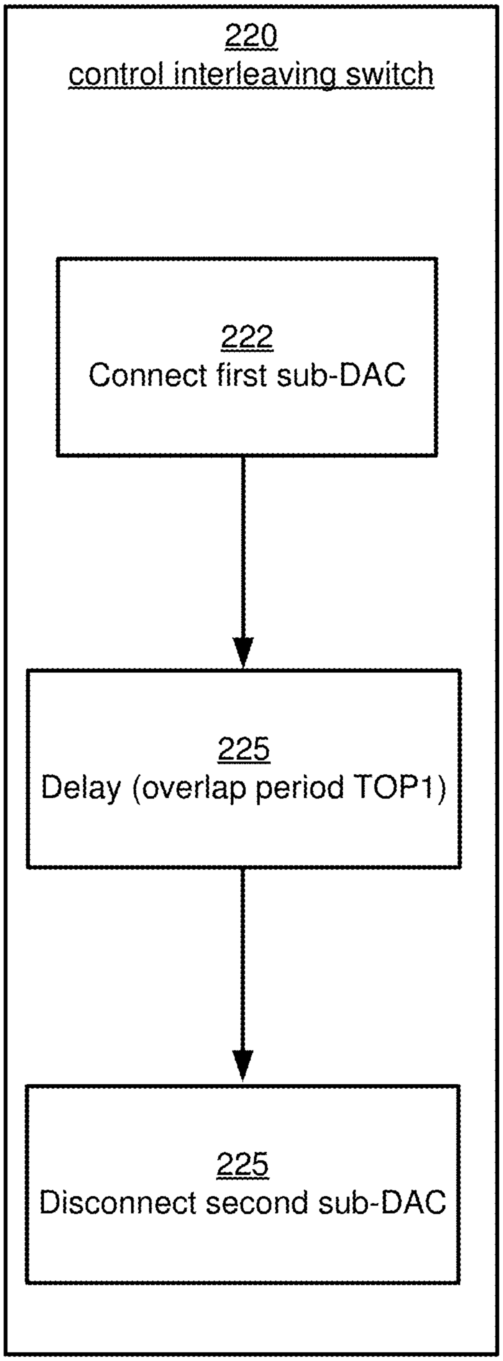
FIG. 8 is a flow chart of part of a method for controlling a time-interleaved current-steering digital to analog converter according to embodiments of the present disclosure.

Alternatively, or additionally, embodiments of the IC 400 may be configured to cause performance of (e.g., perform) one or more steps of the method 200 described in connection with FIGS. 7-9.

FIGS. 12*a-f* schematically illustrates an example electronic equipment 500 according to some embodiments. The electronic equipment 500 preferably comprises the TI-IDAC 100 according to embodiments disclosed herein, see FIG. 12*a*. In some embodiments, see FIG. 12*b*, the electronic equipment 500 may further comprise the controller 300 according to embodiments disclosed herein. In some embodiments, see FIG. 12*c*, the electronic equipment 500 may comprise the IC 400 according to embodiments disclosed herein and optionally, see FIG. 12*d*, the electronic equipment 500 may comprise the TI-IDAC 100 operatively connected to the IC 400.

Figure 12A:
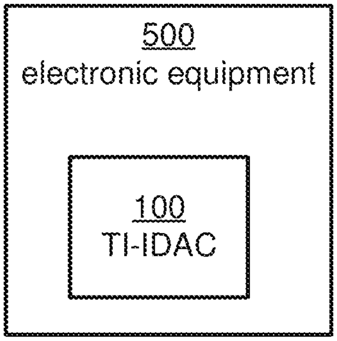
FIGS. 12*a-f* are schematic views of an electronic equipment according to embodiments of the present disclosure.
Figure 12B:
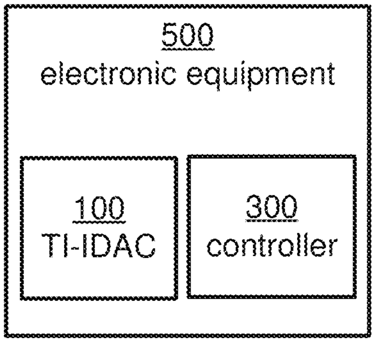
Figure 12C:
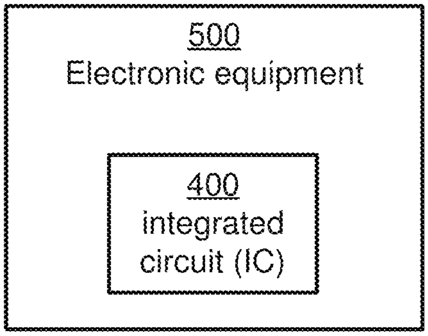
Figure 12D:
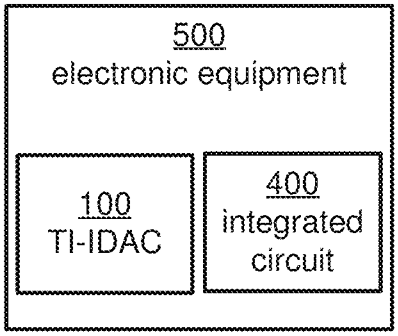
Figure 12E:
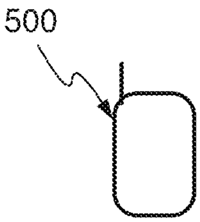
Figure 12F:
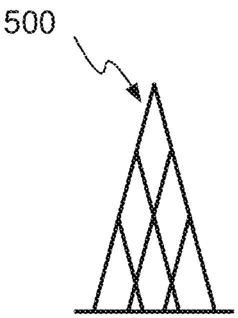

The electronic equipment 500 may be a control node e.g., a wireless device such as a user equipment (UE), see FIG. 12*e*, or a network node such as a radio access node or base station (BS), see FIG. 12*f*.

Alternatively, or additionally, embodiments of the apparatus 500 may be configured to cause performance of (e.g., perform) one or more steps of the method 200 described in connection with FIGS. 7-9.

Figure 13:
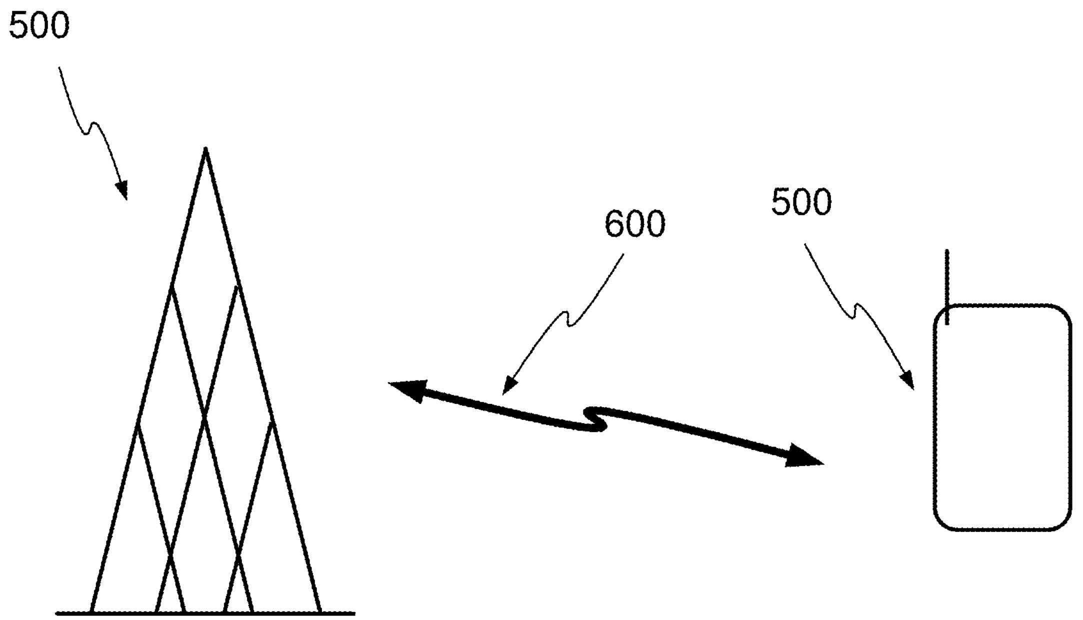
FIG. 13 is a schematic view of a wireless communications network according to embodiments of the present disclosure.

In FIG. 13, one exemplary embodiment of a wireless communications network 600 is illustrated. The wireless communications network 600 comprises at least one electronic equipment 500 in the form of control nodes 500 as described herein.

Figure 14:
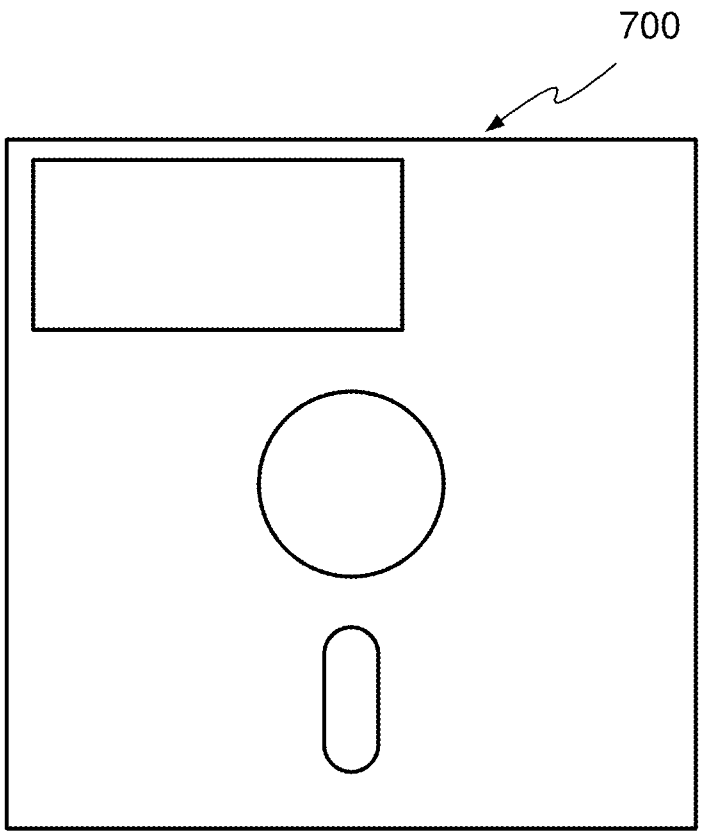
FIG. 14 is a carrier according to embodiments of the present disclosure.
Figure 15:
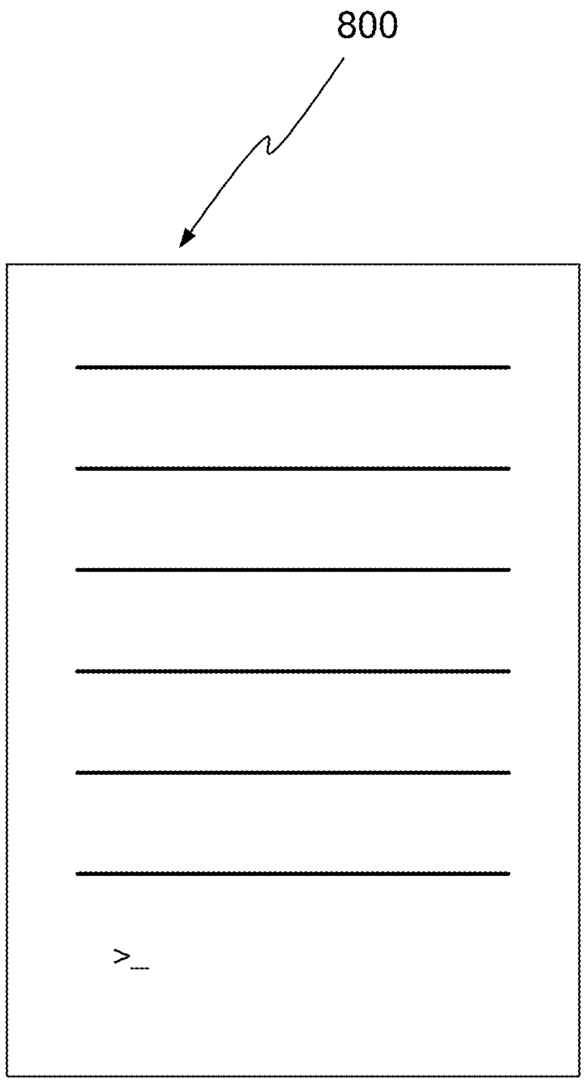
FIG. 15 is a computer program according to embodiments of the present disclosure.
Figure 16A:
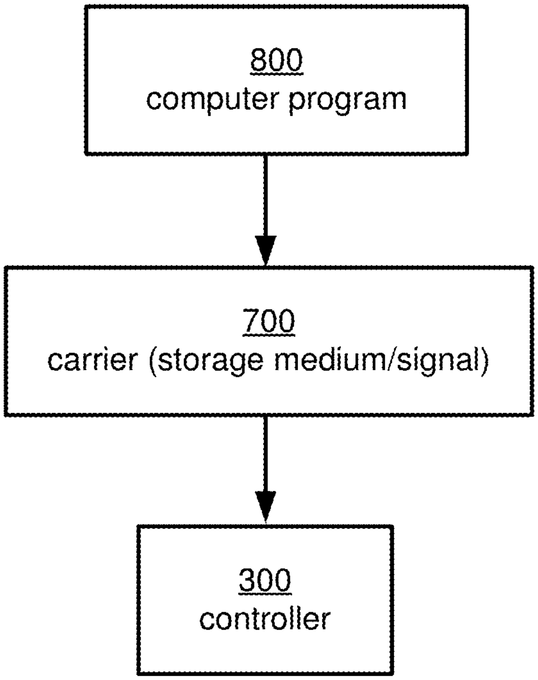
FIGS. 16*a-c* are block diagrams illustrating loadability of the computer program according to embodiments of the present disclosure.
Figure 16B:
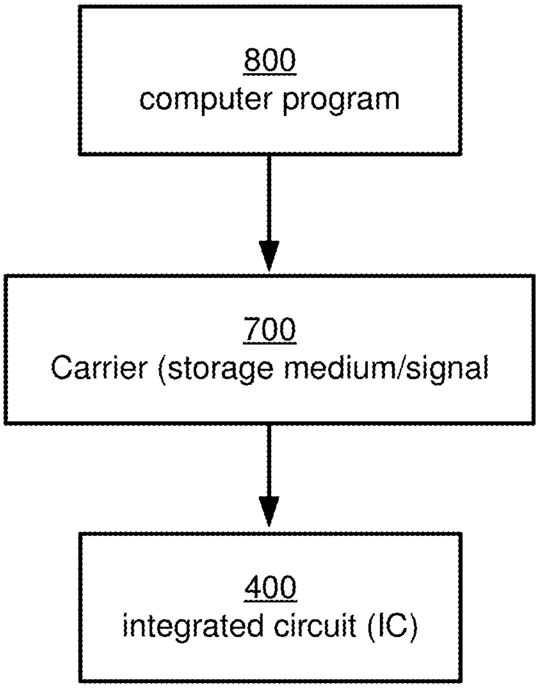
Figure 16C:
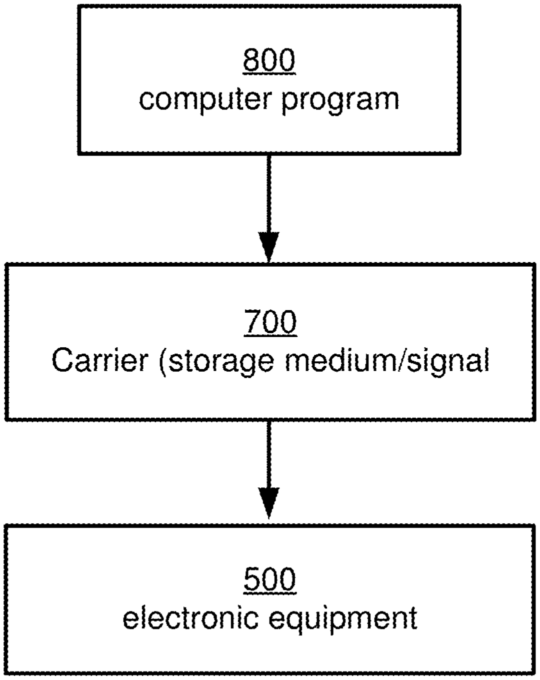

According to some embodiments, a computer program product 700 comprises a carrier 700 (FIG. 14) being one of an electronic signal, an optical signal, a radio signal, or a computer readable storage medium. The computer readable storage medium may be a non-transitory computer readable medium 700 such as, for example, a universal serial bus (USB) memory, a plug-in card, an embedded drive, or a read only memory (ROM). FIG. 14 illustrates an example computer readable medium 700 in the form of a vintage floppy disc 700. The carrier 700 has stored thereon a computer program 800, see FIG. 15, comprising program instructions. The computer program 800 is loadable into one or more of the controller 300 (FIG. 16*a*) according to embodiment of the present disclosure, the IC 400 (FIG. 16*b*) according to embodiment of the present disclosure or the electronic apparatus 500 (FIG. 16*c*) according to embodiments of the present disclosure. When loaded into either of the exemplary devices 300, 400, 500, the computer program 800 may be stored in a memory associated with, or comprised in, the exemplary devices 300, 400, 500. According to some embodiments, the computer program 700 may, when loaded into, and run by, the exemplary devices 300, 400, 500, cause execution of method steps according to, for example, the method 200 described in connection with FIGS. 7-9.

Modifications and other variants of the described embodiments will come to mind to one skilled in the art having benefit of the teachings presented in the foregoing description and associated drawings. Therefore, it is to be understood that the embodiments are not limited to the specific example embodiments described in this disclosure and that modifications and other variants are intended to be included within the scope of this disclosure. For example, while embodiments of the invention have been described with reference to TI-IDACs with two sub-DACs, persons skilled in the art will appreciate that the embodiments of the invention can equivalently be applied to TI-IDACs with more than two sub-DACs and also more generally to other areas where interleaving of current sources is utilized. Furthermore, although specific terms may be employed herein, they are used in a generic and descriptive sense only and not for purposes of limitation. Therefore, a person skilled in the art would recognize numerous variations to the described embodiments that would still fall within the scope of the appended claims. Furthermore, although individual features may be included in different claims (or embodiments), these may possibly advantageously be combined, and the inclusion of different claims (or embodiments) does not imply that a combination of features is not feasible and/or advantageous. In addition, singular references do not exclude a plurality. Finally, reference signs in the claims are provided merely as a clarifying example and should not be construed as limiting the scope of the claims in any way.

The invention claimed is:

1. A time-interleaved current-steering digital to analog converter, TI-IDAC, comprising:

a first sub-DAC, a second sub-DAC, a load switch and an interleaving switch arranged between the sub-DACs and the load switch;

the interleaving switch is being configured to interleave between the sub-DACs by control of a connection between the first sub-DAC and an input port of the load switch, and control of a connection between the second sub-DAC and the input port of the load switch; and the load switch is being configured such that the input port of the load switch is connected to a reset load of the TI-IDAC at least when the interleaving switch changes at least one of the connections between the sub-DACs and the input port of the load switch.

2. The time-interleaved current-steering digital to analog converter of claim 1, wherein the load switch is configured to connect the input port of the load switch to either the reset load or an output load.

3. The time-interleaved current-steering digital to analog converter claim 2, wherein a current mirror is connected between the load switch and the output load, the current mirror is configured to mirror a current of the load switch into the output load.

4. The time-interleaved current-steering digital to analog converter of claim 1, wherein the interleaving switch is configured to control the connection between the first sub-DAC and the input port of the load switch by a second interleaving signal, and the connection between the second sub-DAC and the input port of the load switch by a first interleaving signal, wherein the first interleaving signal and the second interleaving signal are configured to overlap in time by an overlap period.

5. The time-interleaved current-steering digital to analog converter of claim 1, wherein a first data signal is provided to the first sub-DAC controlled by a first data latching clock signal, and a second data signal is provided to the second sub-DAC controlled by a second data latching clock signal being an inverse of the first data latching clock signal.

6. The time-interleaved current-steering digital to analog converter of claim 4, wherein the first interleaving clock signal, the second interleaving clock signal and the first data latching clock operate at a same frequency and the first data latching clock signal is phase shifted with regards to both the first interleaving clock signal and the second interleaving clock signal.

7. The time-interleaved current-steering digital to analog converter claim 5, wherein the first data signal is provided from a main data signal via a first data flip flop of the TI-IDAC latched by the first data latching clock signal and the second data signal is provided from the main data signal via a second data flip flop of the TI-IDAC latched by the second data latching clock signal.

8. The time-interleaved current-steering digital to analog converter of claim 1, wherein the interleaving switch is configured, by the interleaving clock signals, to connect each of the sub-DACs to either the input port of the load switch or to an interleaving load.

9. The time-interleaved current-steering digital to analog converter of claim 1, wherein the reset load is one of a resistor, a diode connected transistor or a current mirror.

10. The time-interleaved current-steering digital to analog converter of claim 9, wherein the interleaving load and the reset load are identical.

11. The time-interleaved current-steering digital to analog converter of claim 1, wherein the first sub-DAC and the second sub-DAC are calibrated to be equal in gain and offset.

12. The time-interleaved current-steering digital to analog converter of claim 1, further comprising a third sub-DAC and wherein the interleaving switch is further configured to interleave between the sub-DACs by control of a connection between the third sub-DAC and an input port of the load switch by a third interleaving signal.

13. The time-interleaved current-steering digital to analog converter of claim 1, wherein each of the sub-DACs comprises one or more DAC cells.

14. The time-interleaved current-steering digital to analog converter of claim 1, wherein the TI-IDAC is comprised in an integrated circuit, IC.

15. The time-interleaved current-steering digital to analog converter of claim 1, wherein the TI-IDAC is comprised in an electronic equipment.

16. The time-interleaved current-steering digital to analog converter of claim 15, wherein the electronic equipment is a network node.

17. The time-interleaved current-steering digital to analog converter of claim 16, wherein the network node is a base station, BS, of a wireless communications network.

18. The time-interleaved current-steering digital to analog converter of claim 15, wherein the electronic equipment is a wireless device.

19. The time-interleaved current-steering digital to analog converter of claim 18, wherein the wireless device is a user equipment, UE, of a wireless communications network.

20. A method of controlling a time-interleaved current-steering digital to analog converter, TI-IDAC, the TI-IDAC comprising a first sub-DAC, a second sub-DAC, a load switch and an interleaving switch arranged between the sub-DACs and the load switch, the interleaving switch is being configured to interleave between the sub-DACs by control of a connection between the sub-DACs and an input port of the load switch, the load switch is being configured to connect the input port of the load switch to either a reset load or an output load, the method comprising:

controlling the load switch to connect the input port of the load switch to the reset load;

subsequently controlling the interleaving switch to connect the first sub-DAC to the input port of the load switch and to disconnect the second sub-DAC from the input port of the load switch; and subsequently controlling the load switch to connect the input port of the load switch to the output load.

21. The method of claim 20, wherein controlling the interleaving switch to connect the first sub-DAC to the input port of the load switch and to disconnect the second sub-DAC from the input port of the load switch, further comprises delaying, for an overlap period, between controlling the interleaving switch to connect the first sub-DAC to the input port of the load switch and controlling the interleaving switch to disconnect the second sub-DAC from the input port of the load switch.

22. The method of claim 20, further comprising, subsequent to controlling the interleaving switch such that the second sub-DAC is disconnected from the input port:

updating a second data signal provided to the second sub-DAC.

23. The method of claim 20 further comprising, after controlling the load switch to connect the first sub-DAC to the output load:

controlling the load switch to connect the input port of the load switch to the reset load, subsequently controlling the interleaving switch to connect the second sub-DAC to the input port of the load switch and to disconnect the first sub-DAC from the input port of the load switch, and subsequently controlling the load switch to connect the input port of the load switch to the output load.

24. The method of claim 23, wherein controlling the interleaving switch to connect the second sub-DAC to the input port of the load switch and to disconnect the first sub-DAC from the input port of the load switch, further comprises delaying, for an overlap period, between controlling the interleaving switch to connect the second sub-DAC to the input port of the load switch and controlling the interleaving switch to disconnect the first sub-DAC from the input port of the load switch.

25. The method of claim 23 further comprising, subsequent to controlling the interleaving switch such that the first sub-DAC is disconnected from the input port:

updating a first data signal provided to the first sub-DAC.

26. A computer storage device storing a computer program comprising instructions which, when executed by a controller connected to an interleaved current-steering digital to analog converter, TI-IDAC, comprising a first sub-DAC, a second sub-DAC, a load switch and an interleaving switch arranged between the sub-DACs and the load switch, the interleaving switch being configured to interleave between the sub-DACs by control of a connection between the first sub-DAC and an input port of the load switch and control of a connection between the second sub-DAC and the input port of the load switch, the load switch being configured such that the input port of the load switch is connected to a reset load of the TI-IDAC at least when the interleaving switch changes at least one of the connections between the sub-DACs and the input port of the load switch, cause the controller to carry out the method, the method comprising:

controlling the load switch to connect the input port of the load switch to the reset load;

subsequently controlling the interleaving switch to connect the first sub-DAC to the input port of the load switch and to disconnect the second sub-DAC from the input port of the load switch; and subsequently controlling the load switch to connect the input port of the load switch to the output load.

* * * * *